United States Patent [19]

Yamamoto et al.

[11] Patent Number: 5,121,347
[45] Date of Patent: Jun. 9, 1992

[54] APPARATUS FOR MANIPULATING TRIANGULAR WAVE SIGNALS USED TO DRIVE A GAUGE HAVING A PAIR OF COILS ARRANGED IN QUADRATURE

[75] Inventors: Tomohisa Yamamoto, Hoi; Hiroyuki Ban, Hazu; Katsuyuki Miyake, Ohbu, all of Japan

[73] Assignee: Nippondenso Co., Ltd., Kariya, Japan

[21] Appl. No.: 429,937

[22] Filed: Nov. 1, 1989

[30] Foreign Application Priority Data

Nov. 1, 1988 [JP] Japan ............... 63-276496
Jul. 13, 1989 [JP] Japan ............... 1-180814

[51] Int. Cl.⁵ ............... G01R 7/00; G01P 3/48
[52] U.S. Cl. ............... 364/570; 324/140 R; 324/167
[58] Field of Search ............... 364/570; 324/140 R, 324/143, 146, 151 R, 151 A, 167

[56] References Cited

U.S. PATENT DOCUMENTS

| | | | |
|---|---|---|---|
| 3,636,447 | 1/1972 | Gelenius | 324/140 R X |
| 3,946,311 | 3/1976 | Baker et al. | 324/167 |
| 4,230,984 | 10/1980 | Taylor | 324/115 |
| 4,827,209 | 5/1989 | Tanaka et al. | 324/143 |
| 4,841,238 | 6/1989 | Birch | 324/167 |
| 4,890,057 | 12/1989 | Kobayashi et al. | 324/140 R X |
| 4,924,178 | 5/1990 | Miyajima | 324/167 X |
| 4,928,060 | 5/1990 | Ito | 324/146 X |

FOREIGN PATENT DOCUMENTS

| | | | |
|---|---|---|---|
| 0077666 | 5/1983 | Japan | 324/146 |
| 60-000368 | 1/1985 | Japan | |
| 62-012877 | 1/1987 | Japan | |

Primary Examiner—Joseph L. Dixon
Attorney, Agent, or Firm—Cushman, Darby & Cushman

[57] ABSTRACT

An apparatus for driving a gauge having coils in quadrature to generate a resultant magnetic field in accordance with currents applied thereto and having a pointer angularly swept by the field, the apparatus having a memory to store a first data defining a relationship between a first level, indicative of the current applied to one of the coils, and an angle of the pointer. The first level has a continous waveform varying in isoceles trapezoid form over an angle range of 0° to 180°. The first data varies symmetrically with the isoceles trapezoid wave at the 180° pointer angle over an angle range of 180° to 360°. The memory is arranged to store second data defining a relationship between a second level indicative of the current applied to the other coil and the pointer angle. The second level has a continuous waveform phase shifted by 90° from the continuous waveform of the first data. The apparatus also has an output generator to generate output signals indicative of first and second levels related to the first and second data. A driving circuit is responsive to the output signals to drive the coils with currents proportional to the first and second levels. Each continuous waveform of the first and second data is modified so as to be cut triangularly at its corner portions.

5 Claims, 17 Drawing Sheets

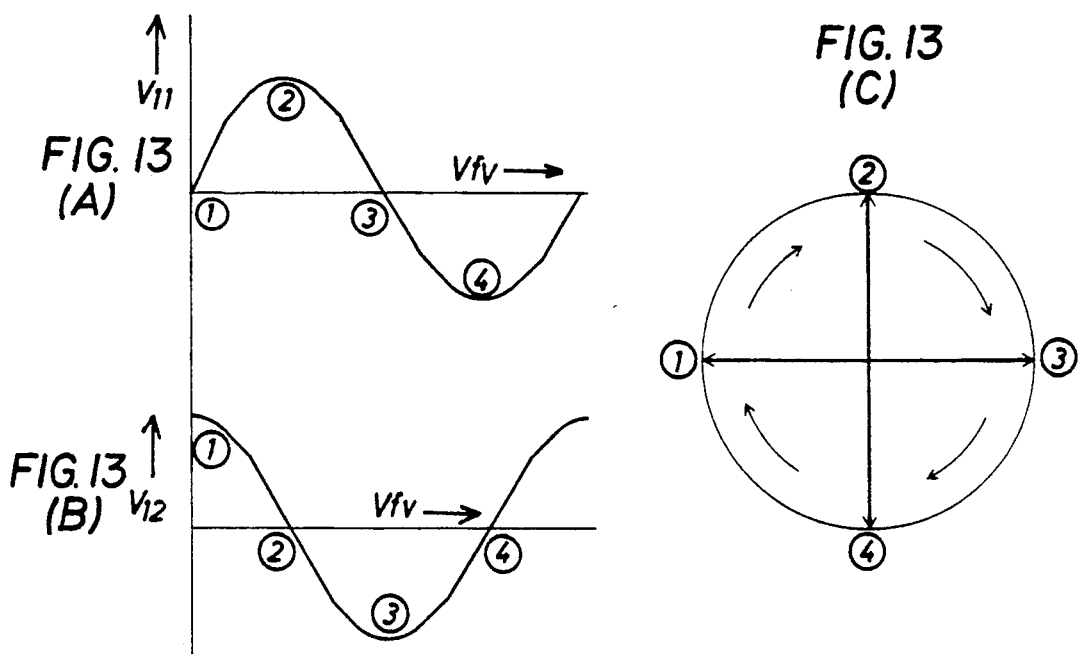
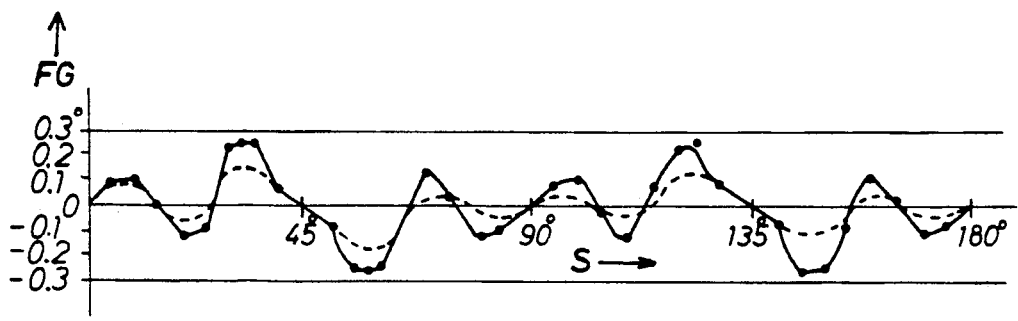

APPARATUS FOR MANIPULATING TRIANGULAR WAVE SIGNALS USED TO DRIVE A GAUGE HAVING A PAIR OF COILS ARRANGED IN QUADRATURE

BACKGROUND OF THE INVENTION

1. The Field of the Art

The present invention relates to an apparatus for driving an air core gauge of the type having a pair of coils in quadrature to generate a resultant magnetic field in accordance with electric currents applied thereto and having a pointer angularly swept by the magnetic field to indicate an input quantity.

2. Description of the Related Art

In Japanese Patent Publication No. 60-368, there has been proposed an apparatus which is arranged to apply to coils a pair of driving signals which vary in phase by 90°. The relationship between the currents applied to the coils and the sweep angle of the pointer is defined by a signal having an isoceles trapezoid waveform. The length in the bottom side of the isoceles trapezoid waveform is longer in comparison to the length of the opposite side of the isoceles trapezoid waveform by a ratio of 2.29. This ratio results in an isoceles trapezoid waveform which approaches waveform of a sine or cosine function. It is, however, observed that corner waveform portions of the isoceles trapezoid waveform have steep bending points causing sudden and large changes. These changes result in faulty gauge readings. For this reason, there is an inherent drawback. The pointer is angularly swept in a breathing mode to give disharmonious feelings to an observer.

SUMMARY OF THE INVENTION

It is a primary object of the present invention to provide an apparatus for driving an air core gauge, enabling a pointer to smoothly sweep over a full range of a sweep angle of the pointer without disharmonious feelings given to an observer.

It is another object of the present invention to provide an apparatus for driving an air core gauge, having the above-mentioned characteristics, which is formed by an analog circuit.

It is a further object of the present invention to provide an apparatus for driving an air core gauge, having the above-mentioned characteristics, capable of preventing minute vibrations of the pointer.

According to the present invention, the object is attained by providing an apparatus for driving a gauge to indicate an input quantity applied thereto. The gauge has first and second coils arranged in quadrature to generate a resultant magnetic field in accordance with electric currents applied thereto and a pointer associated with the first and second coils to be angularly swept by the resultant magnetic field. The apparatus of the present invention having:

a memory means for storing first pattern data defining a relationship between a first signal level indicative of the current applied to the first coil and a sweep angle of the pointer. The relationship being in the form of a continuous waveform varying in isoceles trapezoid form in accordance with a first signal level over a range of 0° to 180° of the sweep angle. The waveform further varies symmetrically with the isoceles trapezoid with respect to a point defined by the sweep angle of 180°, over a range of 180° to 360° of the sweep angle. The memory means being arranged for storing second pattern data defining a relationship between a second signal level. The second signal level being indicative of the current applied to the second coil and the sweep angle in the form of continuous waveform. The continuous waveform being 90° phase shifted from the continuous waveform of the first pattern data.

The apparatus also having output means for determining the first and second signal levels based on the first and second pattern data from the memory means, the output means generating first and second output signals indicative of the first and second determined signal levels.

A driving means responsive to the first and second output signals for driving the first and second coils so as to apply to them electric currents proportional to the first and second determined signal levels respectively.

In the apparatus described above, the continuous waveform of each of the first and second pattern data is modified so as to be cut triangularly at its corner waveform portions.

In an other aspect of the present invention, there is provided an apparatus for driving a gauge to indicate an input quantity applied thereto, the gauge having first and second coils arranged in quadrature to generate a resultant magnetic field in accordance with electric currents applied thereto respectively and a pointer associated with the first and second coils to be angularly swept by the resultant magnetic field. The apparatus comprises:

a signal generator means for generating first, second and third signals when the input quantity is maintained in first, second and third levels corresponding to ranges 0° to 90°, 0° to 180°, and 0° to 270° of the sweep angle respectively;

a first triangular wave generator means responsive to the first and third signals for generating a first triangular wave signal in accordance with the first and third levels of the input quantity;

a second triangular wave generator means responsive to the second signal for generating a second triangular wave signal in accordance with the second level of the input quantity phase shifted by 90° from the first triangular wave signal;

a first function generator means responsive to the first triangular wave signal for generating a first function signal having a modified waveform which results in an approximation of the waveform of a sine function;

a second function generator means responsive to the second triangular wave signal for generating a second function signal having a modified waveform which results in an approximation of the waveform of a cosine function; and driving means responsive to the first and second function signals for driving the first and second coils with electric currents proportional to the levels of the first and second function signals respectively.

In the practical embodiment of the apparatus described above, the signal generator means further comprises:

a reference signal generator means for generating first, second and third reference signals at levels corresponding to 90°, 180° and 270° of the sweep angle respectively;

a first comparator, having a hysteresis characteristic defined by a very narrow hysteresis width including the level of the first reference signal, for generating the first signal only when the first level of the input quantity is maintained below the very narrow hysteresis width;

a second comparator, having a hysteresis characteristic defined by a very narrow hysteresis width including the level of the second reference signal, for generating the second signal only when the second level of the input quantity is maintained below the very narrow hysteresis width of the second comparator; and a third comparator, having a hysteresis characteristic defined by a very narrow hysteresis width including the level of the third reference signal, for generating the third signal only when the third level of the input quantity is maintained below the very narrow width of the third comparator.

BRIEF DESCRIPTION OF THE DRAWINGS

Additional objects, features and advantages of the present invention will be more readily appreciated from the following detailed description of preferred embodiments thereof when taken together with the accompanying drawings, in which:

FIGS. 13(A) and 13(B) depict waveforms of terminal voltages $V_{11}$, $V_{12}$ in relation to an analog voltage $V_{fv}$;

FIG. 13(C) is a graph representing a rotational direction of a resultant magnetic field of magnetic fields caused by the terminal voltages $V_{11}$, $V_{12}$;

FIG. 14 depicts a graph representative of a relationship between the indicating error FG and the angle S in the second preferred embodiment;

DETAILED DESCRIPTION OF THE PREFERRED EMBODIMENTS

Figure 1:
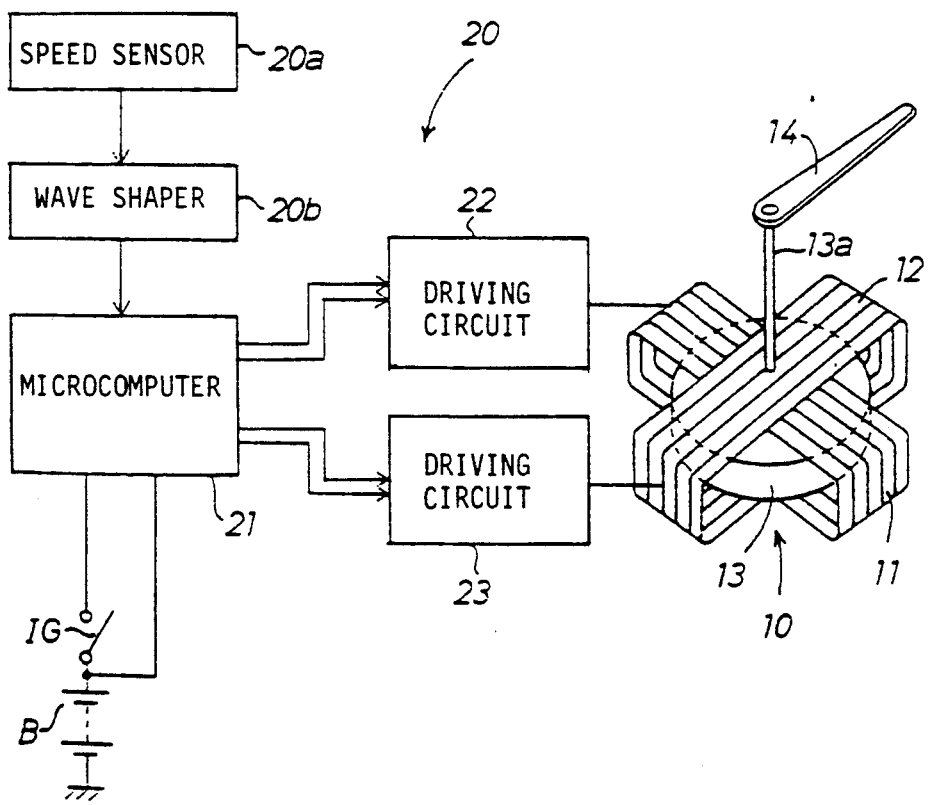
FIG. 1 illustrates a block diagram of a first preferred embodiment in accordance with the present invention.

Referring now to FIG. 1 of the drawings, there is illustrated a first preferred embodiment of a driving apparatus 20 in accordance with the present invention which is adapted to an air core gauge 10. The air core gauge 10 is provided with a pair of windings or coils 11, 12 which are arranged in quadrature to produce magnetic force vectors along their mutually perpendicular axes in accordance with electric currents applied thereto respectively. The coils 11, 12 accommodate therein a permanent magnet 13 of the disc type which is secured to a rotatably supported shaft 13a and provides a predetermined magnetic force vector defined by its magnetic polarity. Then, the permanent magnet 13 rotates together with the shaft 13a in accordance with the combination of the magnetic force vectors from the coils 11, 12 and the shaft's predetermined magnetic force vector to rotate in a clockwise or counterclockwise direction, shown in FIG. 1. A needle pointer 14 is carried on the rotatably supported shaft 13a to sweep along a dial or scale indicating a vehicle speed by rotation of shaft 13a relative to the dial. An angle S of the pointer 14 with respect to a desired zero position varies in accordance with rotation of the shaft 13a relative to the dial. In the embodiment, the shaft 13a is biased by a spiral spring (not shown) in order to move the pointer 14 in the direction defined by decrease of the angle S.

The driving apparatus 20 includes a speed sensor 20a which detects the actual vehicle speed V to generate a series of speed pulse signals at a frequency f(Hz) proportional to the vehicle speed V. A wave shaper 20b reshapes the speed pulse signals from the speed sensor 20a in sequence to generate reshaped pulse signals. A microcomputer 21 cooperates with the wave shaper 20b to execute main and interrupt control programs in accordance with flow diagrams shown in FIGS. 2(A) to 4. During the execution, the microcomputer 21 performs operational processing for control of driving circuits 22, 23.

The driving circuit 22 cooperates with the microcomputer 21 to control an electric current flowing into the coil 11 while the driving circuit 23 cooperates with the microcomputer 21 to control an electric current flowing into the coil 12. The above-mentioned main and interrupt control programs are previously stored in a read-only-memory or ROM of the microcomputer 21. The microcomputer 21 is conditioned in its operation when connected directly to a battery B of the vehicle. Interruption of the interrupt control program in execution in the microcomputer 21 is permitted in response to supplying power to the microcomputer 21 from the battery B through an ignition switch IG of the vehicle.

Figure 5:
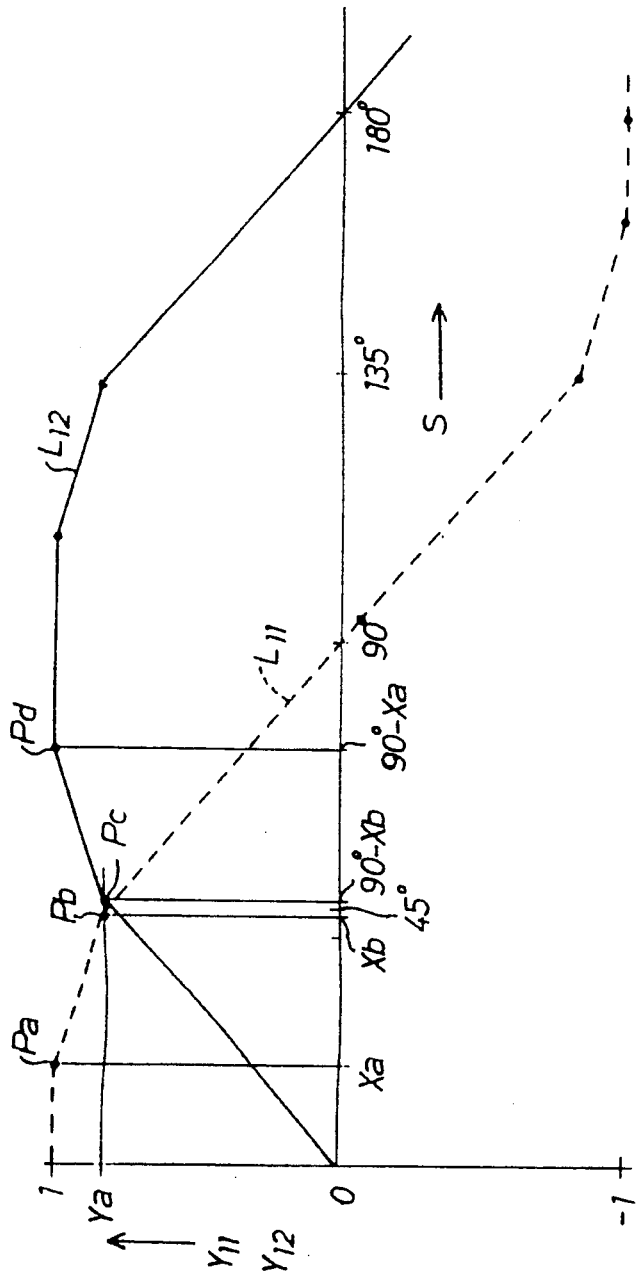
FIG. 5 depicts graphs indicative of relationships between signal levels $Y_{11}$, $Y_{12}$ and an angle S.

In the embodiment, for accomplishing the objects of the present invention, it is to be noted that a signal level $Y_{11}$ proportional to the current flowing into the coil 11 is defined by a characteristic curve $L_{11}$ shown by a dotted line of FIG. 5 with respect to the angle S of pointer 14. Also a signal level $Y_{12}$ proportional to the current flowing into the coil 12 is defined by a characteristic curve $L_{12}$ shown by a solid line of FIG. 5 with respect to the angle S. The characteristic curve $L_{11}$ is defined by the following equations (1), (2) and (3) with respect to a range of $0° \leq S \leq 90°$.

$$Y_{11} = 1 \qquad (0 \leq S \leq Xa) \qquad (1)$$

$$Y_{11} = \frac{Ya - 1}{Xb - Xa}(S - Xa) + 1 \qquad (Xa \leq S \leq Xb) \qquad (2)$$

$$Y_{11} = \frac{-Ya}{90° - Xb}(S - 90°) \qquad (Xb \leq S \leq 90°) \qquad (3)$$

Meanwhile, the characteristic curve $L_{12}$ is defined by the following equations (4), (5) and (6) with respect to the range of $0° \leq S \leq 90°$.

$$Y_{12} = \frac{Ya}{90° - Xb} \cdot S \qquad (0° \leq S \leq 90°) \qquad (4)$$

$$Y_{12} = \frac{1 - Xa}{Xb - Xa}(S - 90° + Xa) + 1 \quad (90° - Xb \leq S \leq 90° - Xa) \qquad (5)$$

$$Y_{12} = 1 \qquad (90° - Xa \leq S \leq 90°) \qquad (6)$$

The characteristic curve $L_{11}$ by $L_{12}$ vary accordingly. Dotted-line portions over respective ranges of $0° \leq S \leq 90°$ and $90° \leq S \leq 180°$ on the characteristic curve $L_{11}$ vary symmetrically to each other with respect to the point defined by $(S, Y_{11}) = (90°, 0)$. Dotted-line portions over respective ranges of $90° \leq S \leq 180°$ and $180° \leq S \leq 270°$ on the characteristic curve $L_{11}$ vary symmetrically to each other with respect to the line defined by $S = 90°$. Dotted-line portions over respective ranges of $180° \leq S \leq 270°$ and $270° \leq S \leq 360°$ on the characteristic curve $L_{11}$ vary symmetrically to each other with respect to the point defined by $(S, Y_{11}) = (270°, 0)$. In addition, a bending point Pa on the characteristic curve $L_{11}$ is defined by $(S, Y_{11}) = (Xa, 1)$, and a bending point Pb on the characteristic curve $L_{11}$ is defined by $(S, Y_{11}) = (Xb, Ya)$.

Meanwhile, solid-line portions over respective ranges of $0° \leq S \leq 90°$ and $90° \leq S \leq 180°$ on the characteristic curve $L_{12}$ vary symmetrically to each other with respect to the line defined by $S = 90°$. Solid-line portions over respective ranges of $90° \leq S \leq 180°$ and $180° \leq S \leq 270°$ on the characteristic curve $L_{12}$ vary symmetrically to each other with respect to the point defined by $(S, Y_{12}) = (180°, 0)$. Solid line portions over respective ranges of $180° \leq S \leq 270°$ and $270° \leq S \leq 360°$ on the characteristic line $L_{12}$ vary symmetrically to each other with respect to the point defined by $(S, Y_{12}) = (270°, 0)$. In addition, a bending point Pc on the characteristic curve $L_{12}$ is defined by $(S, Y_{12}) = (90°-Xb, Ya)$, and a bending point Pd on the characteristic curve $L_{12}$ is defined by $(S, Y_{12}) = (90°-Xa, 1)$.

Figure 2A:
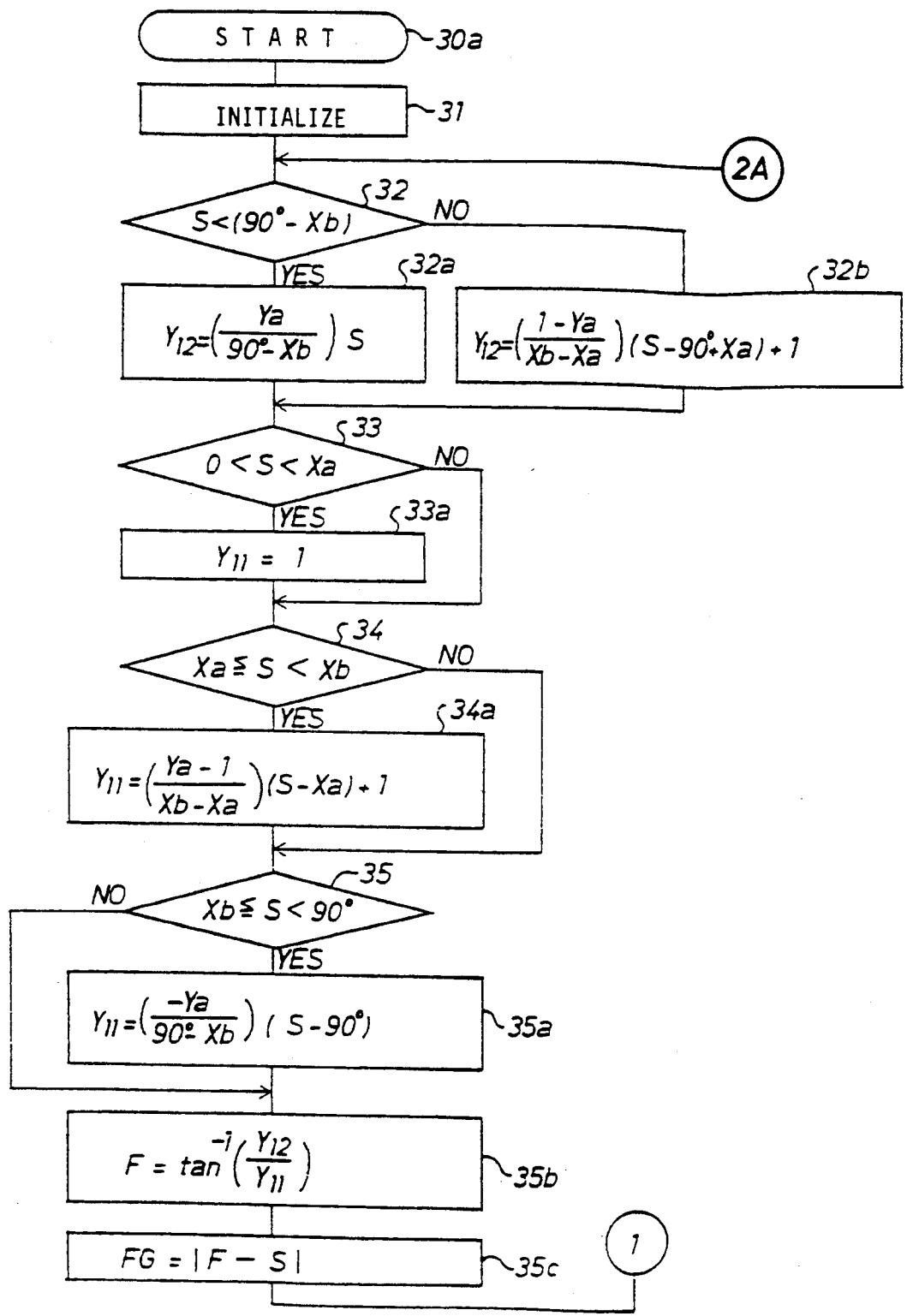
FIGS. 2(A), 2(B), 3(A), 3(B) and 4 represent flow diagrams indicative of operation of a microcomputer shown in block form in FIG. 1.
Figure 2B:
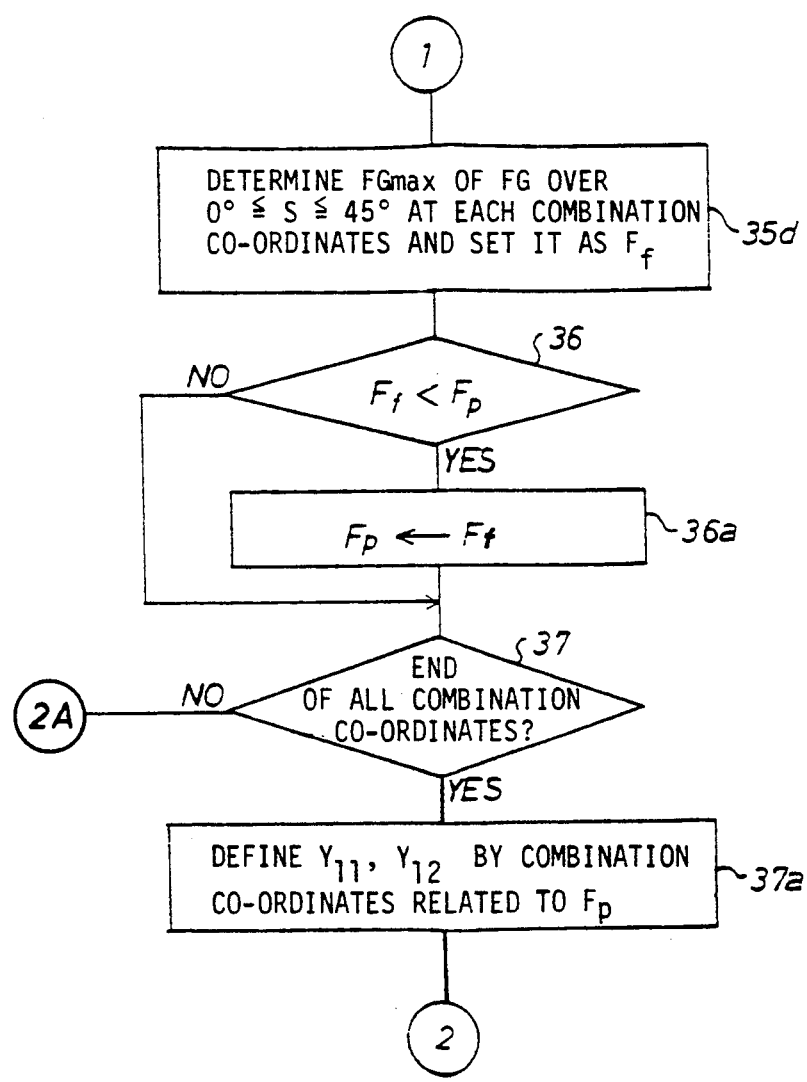

In operation, when connected directly to the vehicle battery B, the microcomputer 21 starts to execute the main control program at a step 30a in accordance with the flow diagram of FIG. 2(A). Then, the microcomputer 21 is initialized at a step 31 to determine at the following step 32 as to whether or not an inequality $S < (90°-Xb)$ is satisfied. In the embodiment, the angle S is previously stored in the ROM of microcomputer 21 having a range of $0° \leq S \leq 45°$ and a predetermined resolving power, such as $0.1°$ together with the inequality $S < (90°-Xb)$.

Assuming that $S = 0.1°$ and $Xb = 1.1°$, $S = 0.1 < (90°-Xb) = 88.9°$, the microcomputer 21 determines a "YES" answer at step 32. When $Ya = 0.1$ at this stage in addition to $S = 0.1°$ and $Xb = 1.1°$, the microcomputer 21 calculates at a step 32a a signal level $Y_{12}$ by using the equation (4) as described above and then determines at a step 33 as to whether or not an inequality $0° < S < Xa$ is satisfied. In the embodiment, the signal level Ya is previously stored in the ROM of microcomputer 21 having a range of $0.1 \leq Ya \leq 0.99$ and the predetermined resolving power such as $0.1°$ together with the equation (4). The angle Xa is previously stored in the ROM of microcomputer 21 having a range from $0° \leq Xa \leq 45°$ and the predetermined resolving power such as $0.1°$ together with the inequality $0° < S < Xa$. In this instance, if $Xa = 0.1°$, the microcomputer 21 determines a "NO" answer at step 33.

Then, the microcomputer 21 determines at the following step 34 a "YES" answer on a basis of satisfaction of an inequality $Xa \leq S \leq Xb$ relative to $Xa = S = 0.1°$ and $Xb = 1.1°$ and in turn calculates at a step 34a a signal level $Y_{11}$ by using the equation (2) in accordance with $S = Xa = 0.1°$, $Xb = 1.1°$ and $Ya = 0.1$. The inequality $Xa \leq S \leq Xb$ is previously stored in the ROM of microcomputer 21 together with the equation (2). Thereafter, the microcomputer 21 determines a "NO" answer at a step 35 on a basis of dissatisfaction of an inequality $Xb \leq S \leq 90°$ relative to $Xb = 1.1°$ and $S = 0.1°$ and then calculates at a step 35b a quasi-angle F of the pointer 14 by using an equation $F = \tan^{-1}(Y_{12}Y_{11})$ in accordance with the calculated signal levels $Y_{12}$; $Y_{11}$ as described above. The inequality $Xb \leq S \leq 90°$ is previously stored in the ROM of microcomputer 21 together with the equation $F = \tan^{-1}(Y_{12}/Y_{11})$.

Furthermore, the microcomputer 21 calculates at a step 35c an indicating error FG by using an equation $FG = |F - S|$ in accordance with $S = 0.1°$ and the calculated quasi-angle F as described above and then determines at a step 35d of FIG. 2(B) the calculated indicating error FG as a maximum value FGmax to be set into the following indicating error Ff. If the following indicating error Ff is smaller than an initial indicating error Fpo, the microcomputer 21 determines at a step 36 a "YES" answer on a basis of satisfaction of $Ff < Fp = Fpo$ and thereafter updates the following indicating error Ff into the preceding indicating error Fp to determine at a step 37 a "NO" answer in relation to $Xa = 0.1$, $Xb = 1.1°$ and $Ya = 0.1$. The equation $FG = |-S|$ is previously stored in the ROM of microcomputer 21 with the initial indicating error Fpo.

Hereinafter, the microcomputer 21 repeats execution of the main control program, in accordance with $Xa = 0.1°$, $Xb = 0.1°$, $Ya = 0.1$ and repetitive increment of the angle S by $0.1°$, as previously described. In the repetitive execution, the microcomputer 21 determines a "YES" answer at step 32, determines a "NO" answer at step 33, determines an "YES" answer at step 34 and determines a "NO" answer at step 35. Then, the microcomputer 21 calculates a quasi-angle F at step 35b, calculates an indicating error FG at step 35c and determines the larger one of the preceding maximum value FGmax and the following indicating error FG as a new maximum value FGmax to be newly set into the following indicating error Ff. Thereafter, if $Ff \geq Fp$ is satisfied, the microcomputer 21 determines a "NO" answer at step 37. If $Ff < Fp$ is satisfied, the microcomputer 21 updates the latest following indicating error Ff to the preceding indicating error Fp to determine at step 37 a "NO" answer.

If an answer at step 32 becomes "NO" in such execution as described above, the microcomputer 21 calculates at a step 32b a signal level $Y_{12}$ by using the equation (5) in accordance with $Xa = 0.1°$, $Xb = 1.1°$, $Ya = 0.1$ and the actual value of the angle S. If an answer at step 33 becomes "YES", the microcomputer 21 determines at step 33a $Y_{11}=1$ by using the equation (1). If an answer at step 35 becomes "YES" after decision as "NO" at step 34, the microcomputer 21 calculates at step 35a a signal level $Y_{11}$ by using the equation (3) in accordance with Ya=0.1, Xb=1.1° and the actual value of the angle S. The equations (1), (3) and (5) are previously stored in the ROM of microcomputer 21. As understood from the above description, it should be noted that signal levels $Y_{12}$ $Y_{11}$ are calculated in accordance with Xa=0.1°, Xb=1.1°=, Ya 0.1 and each value of the angle S over a range of $0° \leq S \leq 45°$ repetitively to calculate each of quasi-angles F and indicating errors FG, that one of the calculated indicating errors FG are updated into a maximum value FGmax repetitively to be set into one of the following indicating errors Ff, and that one of the quasi-angles F is repetitively updated into one of the preceding indicating errors Fp on a basis of satisfaction of Ff<Fp. This means that the latest preceding indicating error Fp is determined in the range of $0° \leq S \leq 45°$ from Xa=0.1°=, Xb=1.1° and Ya=0.1. In the embodiment, (Xa, Xb, Ya) is called a combination co-ordinate.

After executing the main control program through the steps 32-37 in relation to (Xa, Xb, Ya)=(0.1°, 1.1° 0.1) over the range of $0° \leq S \leq 45°$, as previously described, the microcomputer 21 executes the main control program through steps 32-37 over the range of $0° \leq S \leq 45°$ repetitively in accordance with each of combination co-ordinates (Xa, Xb, Ya) which are respectively defined by repetitive changes of one of Xa, Xb and Ya by a value corresponding to a predetermined resolution power. Then, the microcomputer 21 determines the latest preceding indicating error Fp in the substantially same manner relative to (Xa, Xb, Ya)=(0.1°, 1.1° 0.1). Subsequently, the microcomputer 21 executes the main control program through steps 32-37 over the range of $0° \leq S \leq 45°$ in accordance with each of combination co-ordinates respectively defined by selective changes of Xa, Xb and Ya over full ranges of $0° \leq Xa \leq 45°$, $1° \leq Xb \leq 89°$ and $0.1 \leq Ya \leq 0.99$. Thereafter, the microcomputer 21 determines a "YES" answer at step 37.

When determining a "YES" answer at step 37, as previously described, the microcomputer 21 defines at a step 37a the equations (2) to (5) with a combination co-ordinate (Xa, Xb, Ya)=(18.1°, 44°, 0.82) is determined by the latest preceding indicating error Fp obtained at step 36a. This means that the equations relative to the signal levels $Y_{11}$, $Y_{12}$ defining the characteristic curves $L_{11}$, $L_{12}$ can be determined by the equations (1) to (6) in such a manner as to minimize indicating errors at the respective bending points Pa, Pb. The remaining portions of the characteristic curves $L_{11}$, $L_{12}$ over a range of $45° \leq S \leq 360°$ are respectively formed by folding the portions of the characteristic curves $L_{11}$, $L_{12}$ over the range of $0° \leq S \leq 45°$ symmetrically with respect to the particular lines or points as shown in FIG. 5. This means that the characteristic lines $L_{11}$, $L_{12}$ defining the signal levels $Y_{11}$, $Y_{12}$ are formed over the full range of $0° \leq S \leq 360°$ respectively.

Thereafter, a first duty data indicating relationship between the angle S and a duty ratio $D_1$ (see FIG. 8) is determined based on the characteristic curve $L_{11}$ over a range of $0° \leq S \leq 90°$, while a second duty data indicating relationship between the angle S and a duty ratio $D_2$ (see FIG. 8) is determined based on the characteristic curve $L_{12}$ over the range of $0° \leq S \leq 90°$. The duty ratio $D_1$ is defined by the signal level $Y_{11}$ while the duty ratio $D_2$ is defined by the signal level $Y_{12}$. The first and second duty data are stored at step 37b of FIG. 3(A) by the microcomputer 21 in a random-access-memory or RAM of microcomputer 21. In the embodiment, the vehicle speed V has a relationship proportional to the angle S and is previously stored in the ROM of microcomputer 21 as a V-S data. In this case, $0(km/h) \leq V < 75(km/h)$, $75(km/h) \leq V < 150(km/h)$, $150(km/h) \leq V < 225(km/h)$ and $225(km/h) \leq V < 300(km/h)$ correspond to $0° \leq S < 90°$, $90° \leq S < 180°$, $180° \leq S < 270°$, and $270° \leq S < 360°$. In addition, the microcomputer 21 repetitively determines a "YES" answer at a step 38 until the ignition switch IG is closed. S=90° or V=75(km/h) corresponds to 256 bits.

It is assumed that the vehicle starts in response to closure of the ignition switch IG. When receiving power from the battery B through the ignition switch IG, the microcomputer 21 determines a "YES" answer at step 38 of the main control program to be initialized at a step 38a. At this stage, the first and second data stored in the RAM of microcomputer 21 at step 37b is maintained as is. The microcomputer 21 starts execution of the interrupt control program at a step 50a in accordance with the flow diagram of FIG. 4 each time when the wave shaper 20b cooperates with the speed sensor 20a to generate a reshaped pulse signal repetitively. During repetitive execution of the interrupt control program, the microcomputer 21 calculates at a step 51 the actual vehicle speed V from the frequency of each reshaped pulse signal received from wave shaper 20b and then stores at a step 52 the calculated vehicle speed V in its RAM as a 10-bit vehicle speed data. In the embodiment, the upper 2 bits "00", "01", "10" or "11" define the first, second, third or fourth range of the vehicle speed V corresponding to the first, second, third or fourth quadrant of the pointer 14. In addition, the first, second, third and fourth quadrants correspond to the ranges of $0° \leq S < 90°$, $90° \leq S < 180°$, $180° \leq S < 270°$ and $270° \leq S < 360°$ respectively.

If the latest vehicle speed V stored in the RAM at step 52 of the interrupt control program is lower than a predetermined vehicle speed $V_1$ when the main control program proceeds to a step 39, the microcomputer 21 determines a "YES" answer. The predetermined vehicle speed $V_1$ corresponds to 75(km/h) and is previously stored in the ROM of the microcomputer 21. Then, the microcomputer 21 determines at a step 39a that the angle s of pointer 14 belongs to the first quadrant relative to the upper 2 bits "00" of the vehicle speed V. Subsequently, the microcomputer 21 determines at the same step 39a the angle S from the V-S data in accordance with the vehicle speed V to determine the duty ratios $D_1$, $D_2$ on a basis of the first and second duty data (see FIG. 8). Thereafter, the microcomputer 21 generates, at a step 43, a quadrant output signal indicative of the first quadrant determined at step 39a and also first and second duty output signals indicative of the duty ratios $D_1$, $D_2$ respectively determined at step 39a. Thus, the coils 11, 12 cooperate with the driving circuits 22, 23 in response to the quadrant and first and second duty output signals from the microcomputer 21 to sweep the pointer 14 toward the determined angle S within the first quadrant.

Figure 3A:
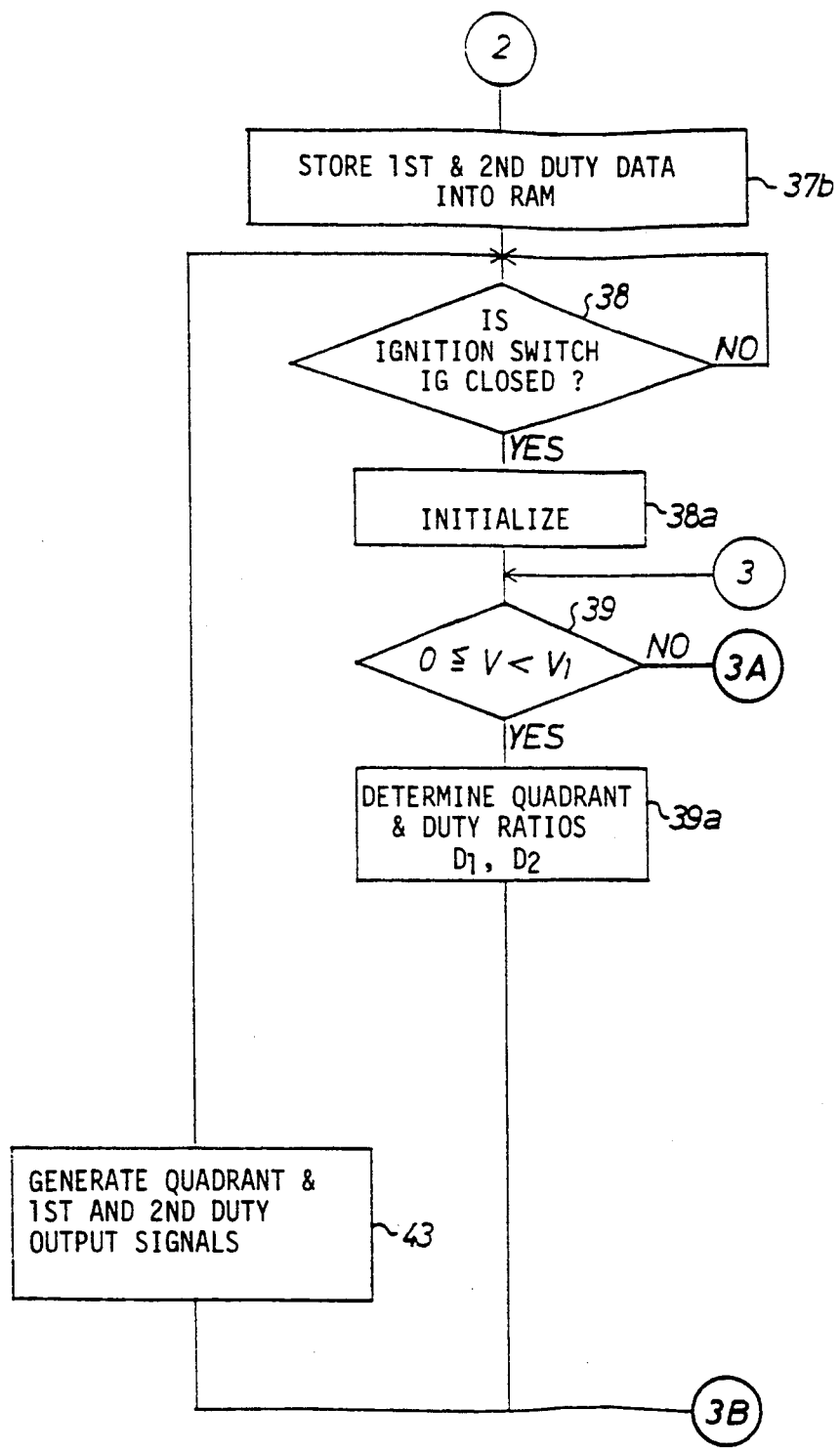
Figure 3B:
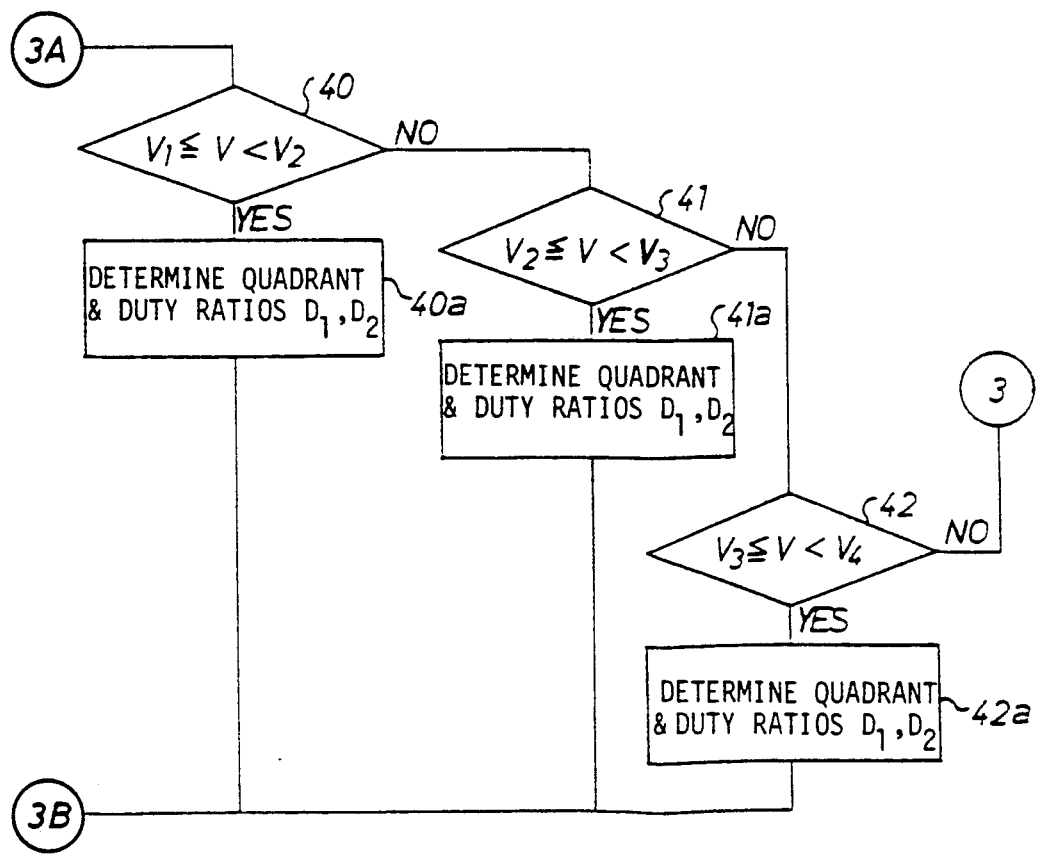
Figure 4:
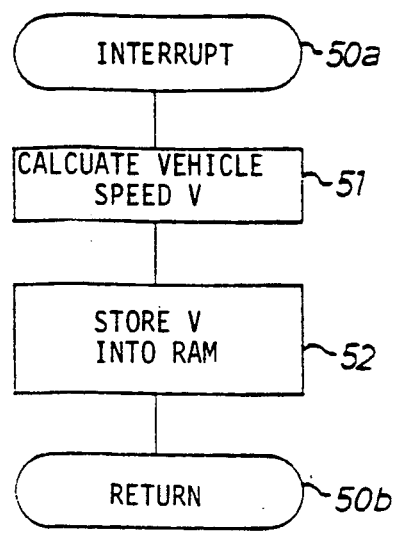

If the vehicle speed V obtained at step 52 is higher than or equal to the predetermined vehicle speed $V_1$ and lower than a predetermined vehicle speed $V_2$ when the main control program proceeds to the step 39 as previously described, the microcomputer 21 determines a "NO" answer to determine a "YES" answer at a step 40 of FIG. 3(B). The predetermined vehicle speed $V_2$ corresponds to 150(km/h) and previously stored in the ROM of microcomputer 21. Thereafter, the microcomputer 21 determines at a step 40a that the angle S of the pointer 14 belongs to the second quadrant relative to the upper 2 bits "01" of the vehicle speed and in turn determines an angle S from the V-S data in accordance with the vehicle speed V to subtract the determined angle S from a predetermined angle $S_{90}$ indicative of $S=90°$. The predetermined angle $S_{90}$ is previously stored in the ROM of the microcomputer 21. Then, the microcomputer 21 determines at the same step 40a duty ratios $D_1$, $D_2$ from the first and second duty data in accordance with the subtraction value of the determined angle S from the predetermined angle $S_{90}$ to generate at step 43 a quadrant output signal indicative of the second quadrant determined at step 40a and first and second duty output signals respectively indicative of the duty ratios $D_1$, $D_3$ determined at step 40a. Thus, the coils 11, 12 cooperate with the driving circuits 22, 23 in response to the quadrant and first and second duty output signals issued by way of steps 40a, 43 from the microcomputer 21 to sweep the pointer 14 toward the determined angle S within the second quadrant.

If the vehicle speed V obtained at step 52 is higher than or equal to the predetermined vehicle speed $V_2$ and lower than a predetermined vehicle speed $V_3$ when the main control program proceeds to step 39, as previously described, the microcomputer 21 determines at steps 39, 40 a "NO" answer in sequence to determine a "YES" answer at step 41. The predetermined vehicle speed $V_3$ corresponds to 225(km/h) and previously stored in the ROM of the microcomputer 21. Thereafter, the microcomputer 21 determines at a step 41a that the angle S belongs to the third quadrant relative to the upper 2 bits "10" of the vehicle speed V and in turn determines an angle S from the V-S data in accordance with the vehicle speed V. Then, the microcomputer 21 determines at the same step 41a duty ratios $D_1$, $D_2$ from the first and second duty data in accordance with the determined angle S to generate at step 43 a quadrant output signal indicative of the third quadrant determined at step 41a and first and second duty output signals respectively indicative of the duty ratios $D_1$, $D_2$ determined at step 41a. Thus, the coils 11, 12 cooperate with the driving circuits 22, 23 in response to the quadrant and first and second duty output signals issued by way of steps 41a, 43 from the microcomputer 21 to sweep the pointer 14 toward the determined angle S within the third quadrant.

If the vehicle speed V obtained at step 52 is higher than or equal to the predetermined vehicle speed $V_3$ and lower than a predetermined vehicle speed $V_4$ when the main control program proceeds to step 39, as previously described, the microcomputer 21 determines at steps 39, 40, 41 a "NO" answer in sequence to determine a "YES" answer at a step 42. The predetermined vehicle speed $V_4$ corresponds to 300(km/h) and previously stored in the ROM of microcomputer 21. Thereafter, the microcomputer 21 determines at a step 42a that the angle S belongs to the fourth quadrant relative to the upper 2 bits "11" of the vehicle speed V and in turn determines an angle S from the V-S data in accordance with the vehicle speed V to subtract the determined angle S from a predetermined angle $S_{270}$ indicative of $S=270°$. The predetermined angle $S_{270}$ is previously stored in the ROM of microcomputer 21. Then, the microcomputer 21 determines at the same step 42a duty ratios $D_1$, $D_2$ from the first and second duty data in accordance with the subtraction value of the determined angle S from the predetermined angle $S_{270}$ to generate at step 43 a quadrant output signal indicative of the fourth quadrant determined at step 42a and first and second duty output signals respectively indicative of the duty ratios $D_1$, $D_2$ determined at step 42a. Thus, the coils 11, 12 cooperate with the driving circuits 22, 23 in response to the quadrant and first and second duty output signals issued by way of steps 42a, 43 from the microcomputer 21 to sweep the pointer 14 toward the determined angle S within the fourth quadrant.

Figure 8:
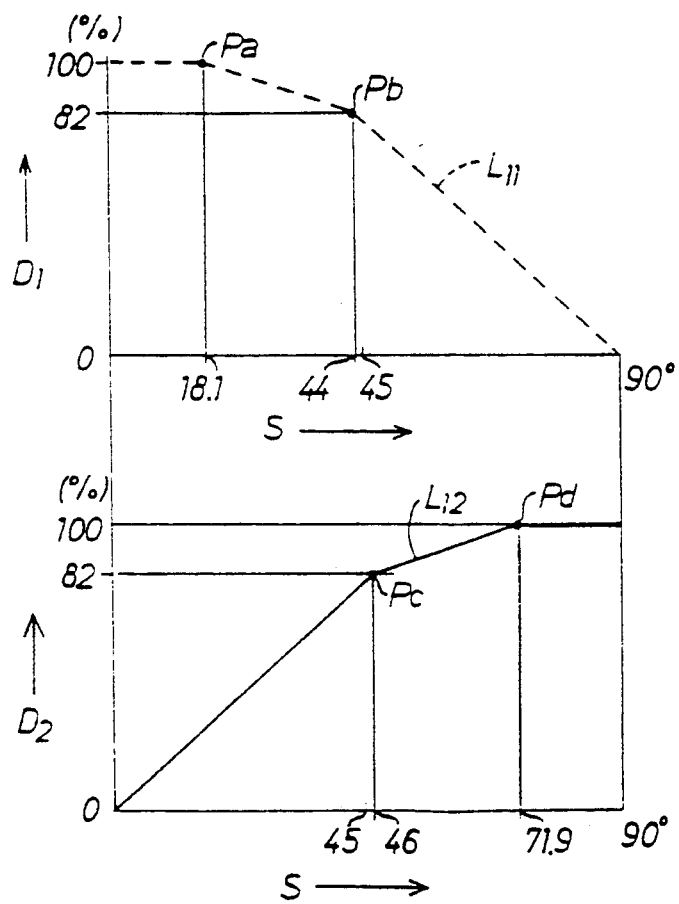
FIG. 8 depicts graphs indicative of relationships between first and second duty data and the angle S.

As previously described in detail, the equations (1) to (6) are determined by each value of Xa, Xb and Ya related to a minimum value among the maximum values FGmax of |F-S| at each combination co-ordinate to provide the first and second duty data (see FIG. 8). The electric currents flowing into the coils 11, 12 are controlled by the driving circuits 22, 23 in accordance with the first and second duty output signals related to the first and second duty data respectively. This reduces indicating errors at respective bending points Pa-Pd (see FIG. 5) on waveforms of the first and second duty output signals. As a result, the pointer 14 can be smoothly swept around the bending points Pa-Pd without disharmonious feelings given to a driver.

Figure 6:
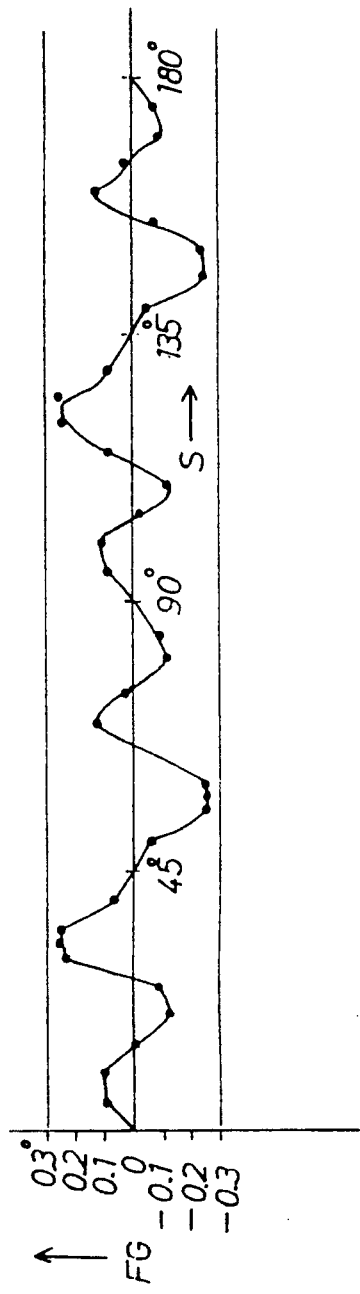
FIG. 6 depicts a graph indicative of the relationship between an indicating error FG and the angle S in the first preferred embodiment.
Figure 7:
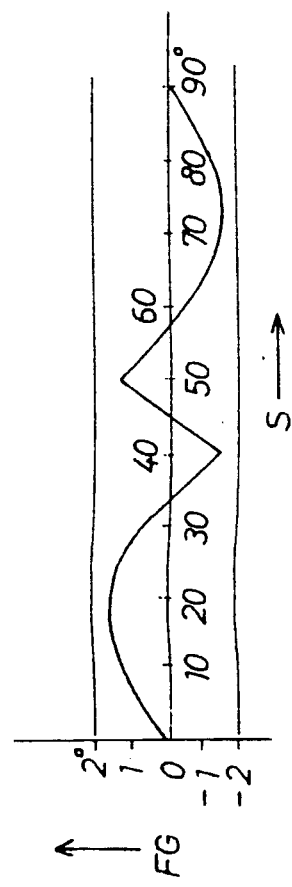
FIG. 7 depicts a graph indicative of a relationship between the indicating error FG and the angle S in the prior art utilizing an isoceles trapezoid waveform.

Incidentally, FIG. 6 depicts a characteristic curve representing an indicating error FG over an angle S given by a waveform defined by characteristic curves $L_{11}$, $L_{12}$. FIG. 7 depicts a characteristic curve representing an indicating error FG over an angle S given by the isoceles trapezoid waveform of prior arts. From the characteristic curves of FIGS. 6 and 7, it is recognized that the magnitude and changing rate of indicating errors shown by characteristic curves $L_{11}$, $L_{12}$ are significantly reduced in comparison with indicating errors resulting from the isoceles trapezoid waveform of the prior art and about the bending points of such an isoceles trapezoid waveform.

For practice of the present invention, the first and second duty data may be previously stored in the ROM of the microcomputer 21.

Figure 9:
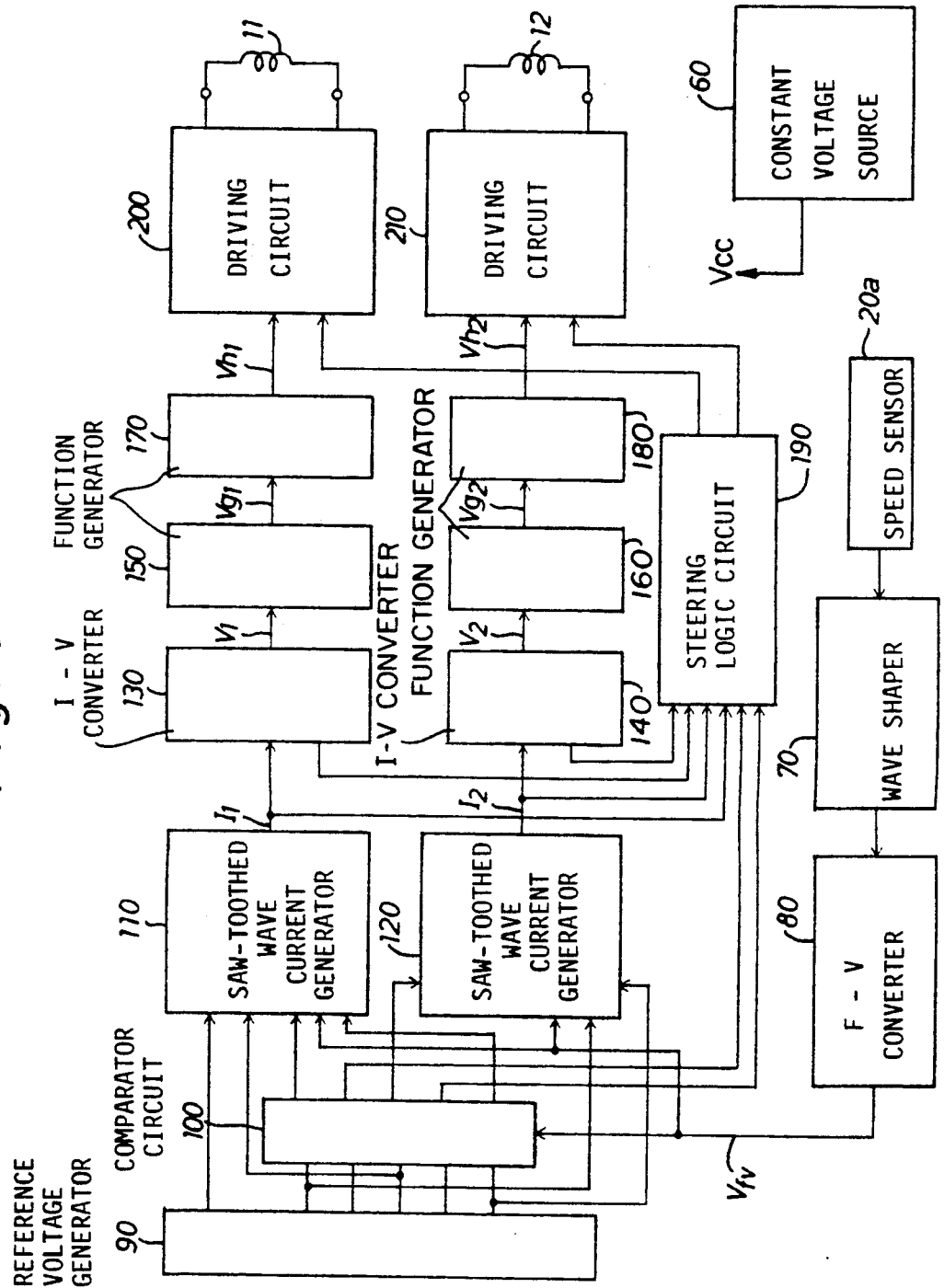
FIG. 9 illustrates a partial block diagram of a second preferred embodiment in accordance with the present invention.
Figure 10:
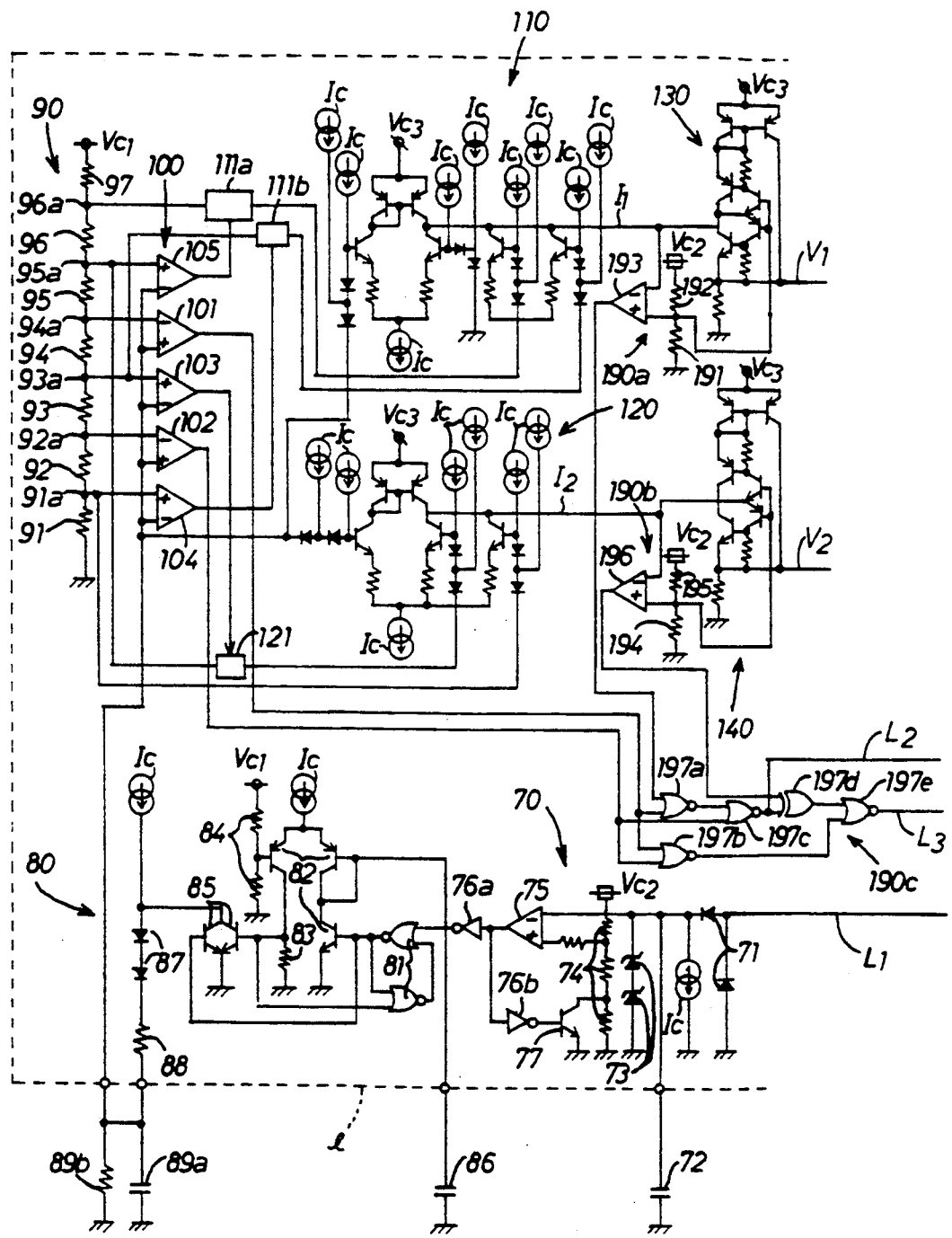
FIGS. 10(A) and 10(B) represent a detailed circuit diagram of the block diagram of FIG. 9.
Figure 10:
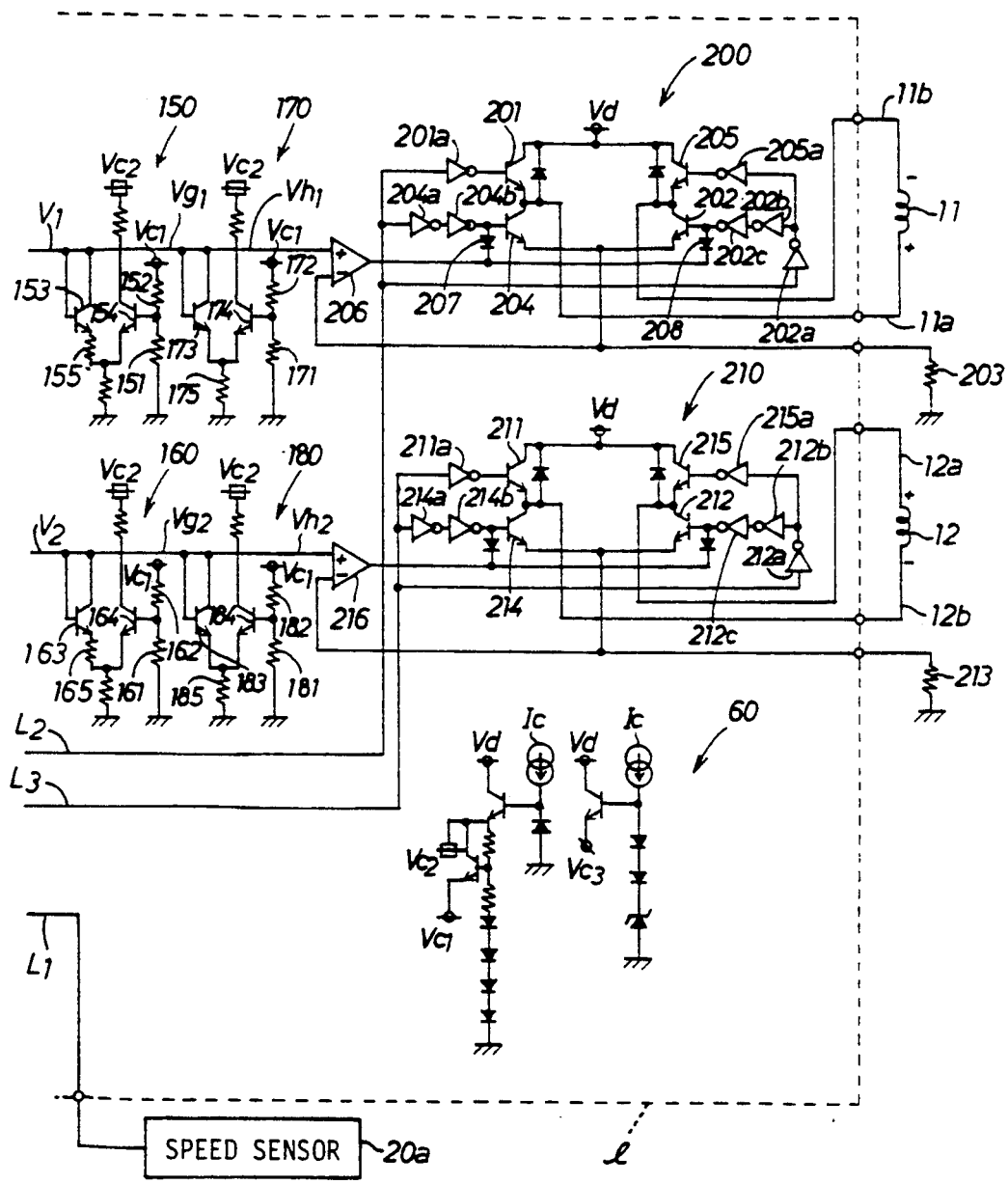

FIGS. 9, 10(A) and 10(B) illustrate a second preferred embodiment of the present invention. The second embodiment is characterized in that an analog circuit shown in FIGS. 9, 10(A) and 10(B) is connected between the coils 11, 12 and the speed sensor 20a in place of the wave shaper 20b, the microcomputer 21 and the driving circuits 22, 23 of the first embodiment. A constant voltage source 60 receives a D.C. voltage Vd from a D.C. voltage source and a constant current from a constant current source Ic to generate constant voltages $V_{c1}$, $V_{c2}$, and $V_{c3}$. A wave shaper 70 includes diodes 71, a capacitor 72 for charge and discharge, a constant current source Ic, zener diodes 73, resistors 74, a comparator 75, inverters 76a, 76b and a transistor 77. The wave shaper 70 reshapes the speed pulse signals (see FIG. 11(A)) from the speed sensor 20a in sequence to generate reshaped pulse signals (see FIGS. 11(B)(B')) through the inverter 76a. A frequency-to-voltage or F-V converter 80 includes OR gates 81, transistors 82, resistors 83, 84, transistors 85, a capacitor 86 for charge, diodes 87, a resistor 88, a smoothing capacitor 89a, a resistor 89b for current-to-voltage conversion and constant current source Ic. The F-V converter 80 converts a frequency f(Hz) of each reshaped pulse signal from wave shaper 70 into an analog voltage $V_{fv}$ (see FIG. 11(C)) proportional to the frequency f and generates the analog voltage $V_{fv}$ through the resistor 89b.

A reference voltage generator 90 has resistors 91-97 which are connected in series to each other to divide the constant voltage $V_{c1}$ from constant voltage source 60 into first to sixth reference voltages so as to generate the same reference voltages respectively at their common terminals 91a to 96a. The first to sixth reference voltages correspond to 0.5(V), 0.75(V), 1(V), 1.25(V), 1.5(V), 1.75(V) and 2(V), respectively. In the embodiment, a full range 0°-360° of the angle S corresponds to a range of 0(V)-2(V). 90°, 180° and 270° of the angle S correspond to 0.5(V), 1(V) and 1.5(V), respectively.

A comparator circuit 100 has a plurality of comparators 101 to 105. The comparator 101 compares the analog voltage $V_{fv}$ from F-V converter 80 with the fourth reference voltage from the common terminal 94a of reference voltage generator 90. Then, the comparator 101 generates a comparing signal with a high or low level when the analog voltage $V_{fv}$ is higher or lower than the fourth reference voltage. The comparator 102 compares the analog voltage $V_{fv}$ with the second reference voltage from common terminal 92a of reference voltage source 90. Then, the comparator 102 generates a comparing signal with a high or low level when the analog voltage $V_{fv}$ is higher or lower than the second reference voltage.

The comparator 103 compares the analog voltage $V_{fv}$. With the third reference voltage from reference voltage generator 90. Then, the comparator 103 generates a comparing signal with a high or low level when the analog voltage $V_{fv}$ is lower or higher than the third reference voltage. The comparator 104 compares the analog voltage $V_{fv}$ with the first reference voltage from reference voltage generator 90. Then, the comparator 104 generates a comparing signal with a high or low level when the analog voltage $V_{fv}$ is lower or higher than the first reference voltage. The comparator 105 compares the analog voltage $V_{fv}$ with the fifth reference voltage from reference voltage generator 90. Then, the comparator 105 generates a comparing signal with a high or low level when the analog voltage $V_{fv}$ is lower or higher than the fifth reference voltage. In this embodiment, a comparator having a hysteresis characteristic is used as each of the comparators 103, 104 and 105.

A saw-toothed wave current generator 110 includes an analog switch 111a which is turned on in response to the comparing signal with high level from comparator 105 and turned off in response to the comparing signal with low level from comparator 105. An analog switch 111b is turned on in response to the comparing signal with high level from the comparator 104 and turned off in response to the comparing signal with low level from the comparator 104. Thus, the saw-toothed wave current generator 110 cooperates with the analog switches 111a, 111b, F-V converter 80, reference voltage generator 90 and comparator circuit 100 to generate a saw-toothed wave current $I_1$ shown in FIG. 11(D). In other words, when receiving the sixth and third reference voltages from reference voltage generator 90 through the turned-on analog switches 111a, 111b respectively, the saw-toothed wave current generator 110 increases the current $I_1$ in proportion to an increase of the analog voltage $V_{fv}$ from F-V converter 80 up to a value $I_{1m}$, from a zero value. Then, the current generator 110 decreases the current $I_1$ instantaneously down to a value $(-I_{1m})$ in response to turning-off of the analog switch 111b, increases the current $I_1$ up to the value $I_{1m}$ in proportion to an increase of the analog voltage $V_{fv}$, again decreases the current $I_1$ instantaneously down to the value $(-I_{1m})$ and increases the current $I_1$ up to the zero value in proportion to an increase of the analog voltage $V_{fv}$.

A saw-toothed wave current generator 120 has an analog switch 121 which is turned on in response to a comparing signal with high level from comparator 103. The analog switch 121 is turned off in response to a comparing signal with low level from comparator 103. Thus, the saw-toothed wave current generator 120 cooperates with the analog switch 121, reference voltage generator 90 and F - V converter 80 to generate a saw-toothed wave current $I_2$ shown in FIG. 11(E). In other words, when receiving the first reference voltage from the reference voltage generator 90 and the fifth reference voltage from the same generator 90 through the turned-on analog switch 121, the current generator 120 increases the current $I_2$ in proportion to an increase of the analog voltage $V_{fv}$ from F-V converter 80 up to a value $I_{2m}$ from a value $(-I_{2m})$. Then, the current generator 120 decreases the current $I_2$ instantaneously down to the value $(-I_{2m})$ in response to turning-off of the analog switch 121 and increases the current $I_2$ in proportion to an increase of the analog voltage $V_{fv}$ up to the value $I_{2m}$ from the value $(-I_{2m})$.

Figure 12:
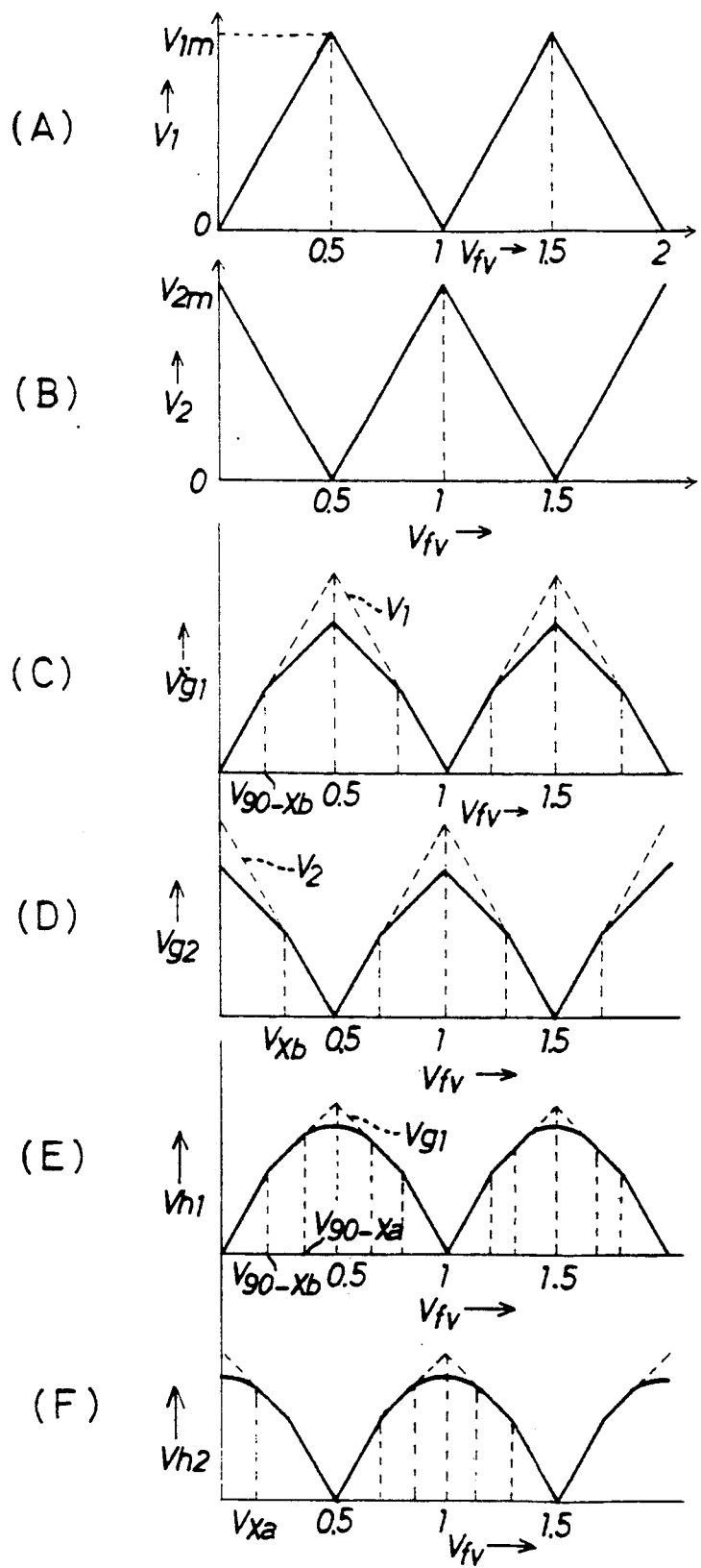

A current-voltage or I-V converter 130 converts the current $I_1$ from the current generator 110 into a triangular wave voltage $V_1$ shown in FIG. 12(A) while a current-voltage or I-V converter 140 converts the current $I_2$ from the current generator 120 into a triangular wave voltage $V_2$ shown in FIG. 12(B). Each of the voltages $V_1$, $V_2$ changes in the form of triangular wave pattern in accordance with an increase of the analog voltage $V_{fv}$ from F-V converter 80.

A function generator 150 has resistors 151, 152 which are connected in series to each other to divide the constant voltage $V_{c1}$ from the constant voltage generator 60 into a divided voltage. The divided voltage from the resistors 151, 152 corresponds to an analog voltage $V_{fv} = V_{90-xb}$ which is defined by the signal level $Y = Ya = 0.82$ relative to the angle $S = 90° - Xb = 46°$, as previously described in the first embodiment. Then, the function generator 150 modifies the triangular wave voltage $V_1$ from I-V converter 130 in relation to the divided voltage from the resistors 151, 152 to generate a function voltage $V_{g1}$ having a bent line waveform shown in FIG. 12(C). In this instance, the waveform of the function voltage $V_{g1}$ has a bending point at $V_{fv} = V_{90-xb}$ and changes symmetrically with respect to the particular lines respectively defined by $V_{fv} = 0.5$ and $V_{fv} = 1$. Furthermore, an electric current $i_1$ flowing into the resistor 155 of function generator 150 through the transistor 153 is defined by the following equation (7).

$$i_1 = \frac{1}{R_1}(V_1 - V_{BE1} - V_A + V_{BE2}) \quad (7)$$

wherein the reference character $V_{BE1}$ is a base-emitter voltage of transistor 153, wherein the reference character $V_{BE2}$ is a base-emitter Voltage of transistor 154, wherein the reference character $R_1$ is a resistance value of the resistor 155, and wherein the reference character $V_A$ is the divided voltage from the resistors 151, 152. This means that the equation (7) defines bending degree at each of the bending points on the waveform of the function voltage $V_{g1}$.

A function generator 160 has resistors 161, 162 which are connected in series to each other to divide the constant voltage $V_{c1}$ from constant voltage generator 60 into a divided voltage. The divided voltage from the resistors 161, 162 corresponds to the analog voltage $V_{fv} = V_{xb}$ which is defined by the signal level Y=0.82 relative to the angle S=Xb=44° as previously described in the first embodiment. Then, the function generator 160 modifies the triangular wave voltage $V_2$ from I-V converter 140 in relation to the divided voltage from the resistors 161, 162 to generate a function voltage $V_{g2}$ having a bent line waveform shown in FIG. 12(D). In this instance, the waveform of the function voltage $V_{g2}$ has a bending point at $V_{fv} = V_{xb}$ and changes symmetrically with respect to the particular lines respectively defined by $V_{fv} = 0.5$ and $V_{fv} = 1$. Furthermore, an electric current flowing into the resistor 165 of function generator 160 through the transistor 163 is defined by the equation (7) in accordance with a base-emitter voltage of each of the transistors 163, 164, the resistance value of the resistor 165 and the divided voltage from the resistors 161, 162 in the substantially same manner as that in the function generator 150. This means that the equation (7) defines bending degree at each of the bending points on the waveform of the function voltage $V_{g2}$ in the same as the function voltage $V_{g1}$.

A function generator 170 has resistors 171, 172 which are connected in series to each other to divide the constant voltage $V_{c1}$ from constant voltage generator 60 into a divided voltage. The divided voltage from the resistors 171, 172 corresponds to the analog voltage $V_{fv} = V_{90-xa}$. Then, the function generator 170 modifies the function voltage $V_{g1}$ from the function generator 150 in relation to the divided voltage from the resistors 171, 172 to generate a function voltage $V_{h1}$ shown by a solid line in FIG. 12(E). In this instance, the waveform of the function voltage $V_{h1}$ has a bending point at the particular point defined by the analog voltage $V_{fv} = V_{90-xa}$ and changes symmetrically with respect to the particular lines defined by $V_{fv} = 0.5$ and $V_{fv} = 1$, respectively. Furthermore, an electric current $i_2$ flowing into the resistor 175 of function generator 170 through the transistor 173 is defined by the following equation (8).

$$i_2 = \frac{V_B - V_{BE4}}{R_2} - I_S \exp\frac{(qV_{BE4})}{KT} \qquad (8)$$

wherein the reference character $V_{BE3}$ is a base-emitter voltage of transistor 173, wherein the reference character $V_{BE4}$ is a base-emitter voltage of transistor 174, wherein the reference character $R_2$ is a resistance value of the resistor 175, and wherein the reference character $V_B$ is the divided voltage from the resistors 171, 172. This means that the equation (8) defines bending degree which is on the waveform of the function voltage $V_{h1}$ and different from the bending degree on the waveform of the function generator $V_{g1}$.

A function generator 180 has resistors 181, 182 which are connected in series to each other to divide the constant voltage $V_{c1}$ from a constant voltage generator into a divided voltage. The divided voltage from the resistors 181, 182 corresponds to the analog voltage $V_{fv} = V_{xa}$ which is defined by the signal level Y=Ya=1 at the angle S=Xa−18.1°. Then, the function generator 180 modifies the function voltage $V_{g2}$ from function generator 160 in relation to the divided voltage from the resistors 181, 182 to generate a function voltage $V_{h2}$ shown by a solid line in FIG. 12(F). In this instance, the waveform of the function voltage $V_{h2}$ has a bending point at the particular point defined by $V_{fv} = V_{xb}$ and changes symmetrically with respect to the particular lines defined by $V_{fv} = 0.5$ and $V_{fv} = 1$, respectively. Furthermore, an electric current flowing into the resistor 185 of function generator 180 through the transistor 183 is defined by the equation (8) in accordance with a base-emitter voltage of each of the transistors 183, 184, the resistance value of the resistor 185 and the divided voltage from the resistors 181, 182 substantially in the same manner as that in the function generator 170. This means that the equation (8) defines bending degree which is on the waveform of the function voltage $V_{h2}$ and different from the bending degree on the waveform of the function voltage $V_{g2}$.

As shown in FIGS. 9, 10(A) and 10(B), a steering logic circuit 190 includes a comparator circuit 190a which is connected to the current generator 110 and I-V converter 130. The comparator circuit 190a has resistors 191, 192 which are connected in series to each other to divide the constant voltage $V_{c2}$ from the constant voltage generator 60 into a divided voltage $V_{c2}/2$. A comparator 193 compares an electric voltage corresponding to the current $I_1$ from current generator 110 with the divided voltage from the resistors 191, 192. Then, the comparator 193 generates a comparing signal with a high or low level when the voltage corresponding to the current $I_1$ is lower or higher than the divided voltage from resistors 191, 192.

The steering logic circuit 190 includes a comparator circuit 190b which is connected to the current generator 120 and I-V converter 140. The comparator circuit 190b has resistors 194, 195 which are connected in series to each other to divide the constant voltage $V_{c2}$ from the constant voltage generator 60 into a divided voltage $V_{c2}/2$. A comparator 196 compares an electric voltage corresponding to the current $I_2$ from the current generator 120 with the divided voltage from the resistors 195, 196. The comparator 196 generates a comparing signal with a high or low level when the voltage corresponding to the current $I_2$ is lower or higher than the divided voltage from the resistors 195, 196.

Furthermore, the steering logic circuit 190 includes a logic circuit 190c which is connected to the comparator circuits 100, 190a, 190b. The logic circuit 190c is provided with a NOR gate 197a connected to the comparators 101, 193 and with a NOR gate 197b connected to the comparators 101, 102. The logic circuit 190c is also provided with a NOR gate 197c connected to the comparator 102 and NOR gate 197a, with an exclusive OR gate 197d connected to the comparator 196 and a NOR gate 197c and with a NOR gate 197e connected to the exclusive OR gate 197d and a NOR gate 197b. Thus, the logic circuit 190c generates first and second steering signals through the NOR gates 197c, 197e respectively in relation to levels of the comparing signals from the comparators 101, 102, 193 and 196.

In this connection, assuming that the first and second steering signals from NOR gates 197c and 197e are indicated by the reference characters Dsin and Dcos respectively and also that the low and high levels are indicated by the binary digits "0" and "1" respectively and the comparing signals from comparators 101, 102, 103, 104, 105, 193 and 196 are indicated by the reference characters Ca, Cb, Cs1, Cs2, Cs3, Csin and Ccos respectively, the following (LOGIC TABLE-1) is given with respect to the angle S of pointer 14.

(LOGIC TABLE - 1)

| S° VOLTAGE (V) | 0~90 0~0.5 | 90~180 0.5~0.75 | 0.75~1 | 180~270 1~1.25 | 1.25~1.5 | 270~360 1.5~2 |
|---|---|---|---|---|---|---|
| Ca | 0 | 0 | 0 | 0 | 1 | 1 |
| Cb | 1 | 1 | 0 | 0 | 0 | 0 |
| $C_{s1}$ | 1 | 1 | 1 | 0 | 0 | 0 |
| $C_{s2}$ | 1 | 0 | 0 | 0 | 0 | 0 |
| $C_{s3}$ | 1 | 1 | 1 | 1 | 1 | 0 |
| $C_{sin}$ | 1 | 0 | 0 | 1 | 1 | 0 |
| $C_{cos}$ | 0 | 1 | 1 | 0 | 0 | 1 |
| $D_{sin}$ | 0 | 0 | 0 | 1 | 1 | 1 |
| $D_{cos}$ | 1 | 0 | 0 | 0 | 0 | 1 |

A driving circuit 200 includes transistors 201 and 202. When the first steering signal from NOR gate 197c of the logic circuit 190c is maintained in its low level, the transistor 201 is biased by an inverter 201a to be turned on and simultaneously the transistor 202 is biased by three inverters 202a, 202b, 202c to be turned on. Thus, an electric current corresponding to the ratio (the function voltage $V_{h1}$/a resistance value of a resistor 203) flows into the resistor 203 through the transistor 201, coil 11 and transistor 202. When the first steering signal from NOR gate 197c is inversely maintained in a high level, a transistor 204 is biased by inverters 204a, 204b to be turned on and simultaneously a transistor 205 is biased by inverters 202a, 205a to be turned on. Thus, an electric current corresponding to the ratio (the function voltage $V_{h1}$/the resistance value of resistor 203) flows into the resistor 203 through the transistor 205, coil 11 and transistor 204. This means that the coil 11 produces a magnetic force vector which is defined by the magnitude of the current flowing into the coil 11 and the direction of the same current flowing into the coil 11. In this instance, assuming that both terminals of coil 11 are denoted by the reference characters 11a, 11b respectively as shown in FIG. 10(A), a terminal voltage $V_{11}$ between the terminals 11a, 11b has a waveform shown in FIG. 13(A) with respect to the analog voltage $V_{fv}$ and changes in proportion to the current flowing into the coil 11.

An operational amplifier 206 is operated to cause the function voltage $V_{h1}$ from function generator 170 to accord with a terminal voltage. Diodes 207, 208 are turned on in response to the first steering signal from NOR gate 197c and inversely turned off in response to change of the first steering signal into a low level. This means that the transistors 204, 202 can be turned on only by conduction of the diodes 207, 208, respectively.

A driving circuit 210 includes transistors 211 and 212. When the second steering signal from NOR gate 197e of steering logic circuit 190 is maintained in its low level, the transistor 211 is biased by an inverter 211a to be turned on and simultaneously the transistor 212 is biased by three inverters 212a, 212b and 212c to be turned on. Thus, an electric current corresponding to the ratio (the function voltage $V_{h2}$/the resistance value of resistor 213) flows into the resistor 213 through the transistor 211, coil 12 and transistor 212. When the second steering signal from NOR gate 197e is maintained in its high level, a transistor 214 is biased by inverters 214a, 214b to be turned on and simultaneously a transistor 215 is biased by inverters 212a, 215a to be turned on. Thus, an electric current corresponding to the ratio (the function voltage $V_{h2}$/the resistance value of resistor 213) flows into the resistor 213 through the transistor 215, coil 12 and transistor 214. This means that the coil 12 produces a magnetic force vector which is defined by the magnitude of the current flowing into the coil 12 and the direction of the same current flowing into the coil 12. In this instance, assuming that both terminals of coil 12 are denoted by the reference characters 12a, 12b respectively as shown in FIG. 10(B), a terminal voltage $V_{12}$ between the terminals 12a, 12b has a waveform shown in FIG. 13(B) with respect to the analog voltage $V_{fv}$ and changes in proportion to the current flowing into the coil 12. In addition, the circuit surrounded by a broken line shown in FIGS. 10(A)(B) is formed by an integrated circuit or IC.

In operation, when the vehicle starts as previously described in the first embodiment, the wave shaper 70 cooperates with the speed sensor 20a to generate a series of reshaped pulse signals each of which is converted by the F-V converter 80 in sequence into an analog voltage $V_{fv}$ proportional to a frequency of each reshaped pulse signal. When the vehicle speed increases from V=0 (km/h) to V=300 (km/h), the analog voltage from the F-V converter 80 increases from $V_{fv}$=0(V) to $V_{fv}$=2(V). Thus, the current generators 110, 120 cooperate with the reference voltage generator 90 and comparator circuit 100 to generate saw-toothed wave currents $I_1$, $I_2$ in accordance with an increase of the analog voltage $V_{fv}$ respectively as shown in FIGS. 11(D) and (E).

Then, the steering logic circuit 190 cooperates with the comparator circuit 100 to generate selectively first and second steering signals in accordance with electric voltages corresponding to the current $I_1$, $I_2$ from the current generators 110, 120. And the I-V converter 130 converts the saw-toothed wave current $I_1$ from the current generator 110 into a triangular wave voltage $V_1$ (see FIG. 12(A)) while the I-V converter 140 converts the saw-toothed wave current $I_2$ from the current generator 120 into a triangular wave voltage $V_2$ (see FIG. 12(B)). Then, the function generator 150 generates a function voltage $V_{g1}$ (see FIG. 12(C)) in accordance with the triangular wave voltage $V_1$ from the I-V converter 130 while the function generator 160 generates a function voltage $V_{g2}$ (see 12(C)) in accordance with the triangular wave voltage $V_2$ from the I-V converter 140. Subsequently, the function generator 170 generates a function voltage $V_{h1}$ (see FIG. 12(E)) in accordance with the function voltage $V_{g1}$ from the function generator 150 while the function generator 180 generates a function voltage $V_{h2}$ (see FIG. 12(F)) in accordance with the function voltage $V_{g2}$ from the function generator 160.

Thus, the driving circuit 200 causes electric current flow to the coil 11 with the polarity which is defined by the level of the first steering signal from the steering logic circuit 190 during generation of the function voltage $V_{h1}$ across the resistor 103 under control of the operational amplifier 206, while the driving circuit 210 causes electric current flow to the coil 12 with the polarity which is defined by the level of the second steering signal from the steering logic circuit 190 during generation of the function voltage $V_{h2}$ across the resistor 213 under control of the operational amplifier 216. This means that a terminal voltage $V_{11}$ across the coil 11 changes in accordance with the analog voltage $V_{fv}$, as shown in FIG. 13(A) while a terminal voltage $V_{12}$ across the coil 12 changes in accordance with the analog voltage $V_{fv}$ as shown in FIG. 13(B).

Figure 11:
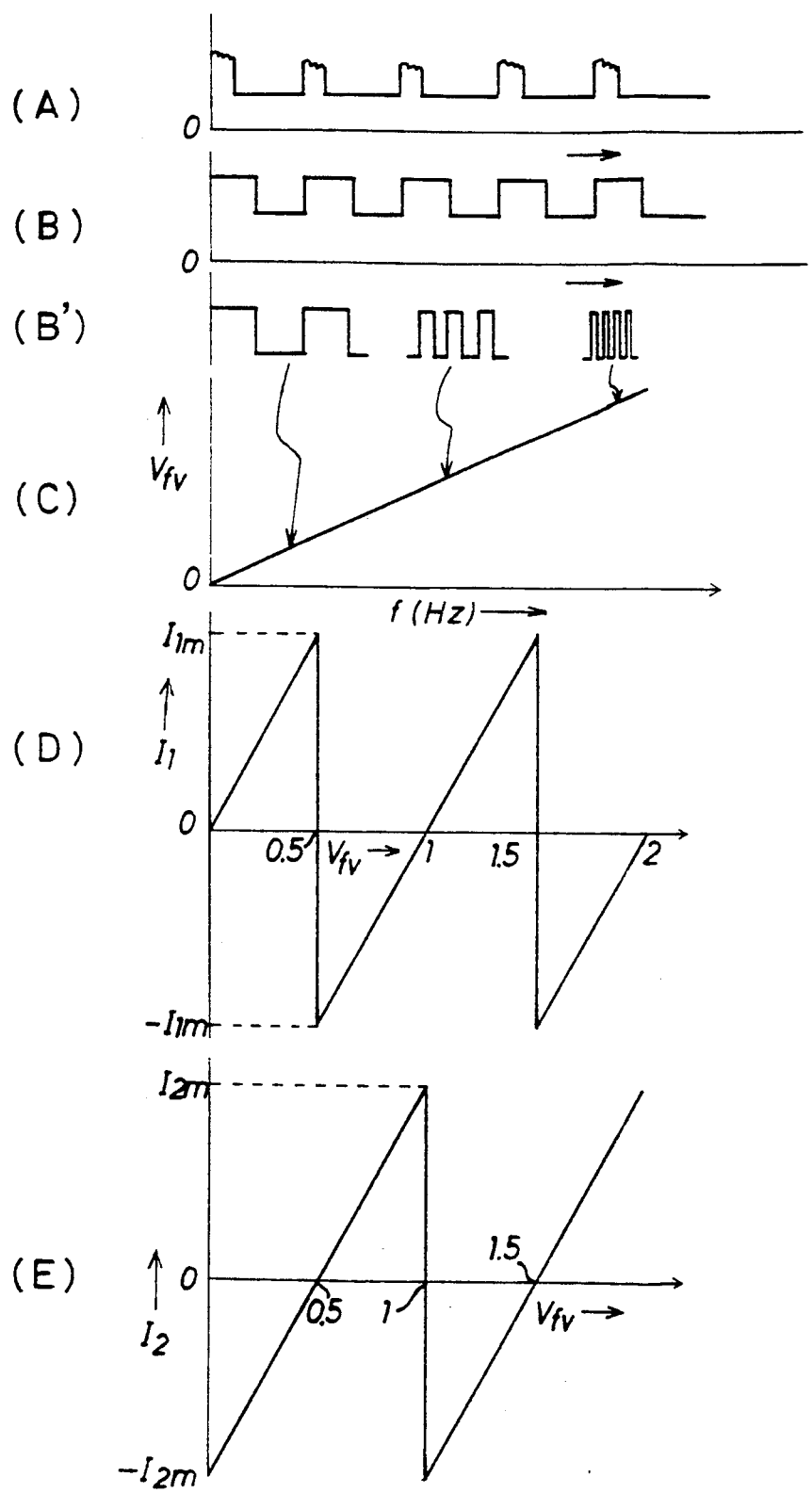
FIGS. 11(A) to (E) and 12(A) to (F) depict waveforms at main points in the circuit diagram of FIGS. 10(A) and 10(B)

In other words, in the range 0(V) to 2(V) of the analog voltage $V_{fv}$, the electric currents $I_1$, $I_2$ have the saw-toothed wave patterns which are shifted from each other by 90° corresponding to the analog voltage $V_{fv}=0.5(V)$ as shown in FIGS. 11(D)(E). The electric voltages $V_1$, $V_2$ have the triangular wave patterns which are shifted from each other by 90° as shown in FIGS. 12(A)(B). The function voltage $V_{g1}$ has the wave pattern modified from the triangular wave voltage $V_1$ as shown in FIG. 12(C), while the function voltage $V_{g2}$ has the wave pattern modified from the triangular voltage $V_2$, as shown in FIG. 12(D). In this instance, the function voltage $V_{g1}$ is formed by enlarging the waveform of the function voltage $V_1$ in vertical angles defined by the analog voltages $V_{fv}=0.5(V)$ and 1.5(V) over ranges of $V_{90-xb} \leq V_{fv} \leq (0.5+V_{90-xb})$ and $(1+V_{90-xb}) \leq V_{fv} \leq (1.5+V_{90-xb})$ respectively, whereas the function voltage $V_{g2}$ is formed by enlarging the waveform of the function voltage $V_2$ in vertical angles defined by the analog voltages $V_{fv}=0(V)$, 0.5(V) and 2(V) over ranges of $0 \leq V_{fv} V_{xb}$, $(0.5+V_{xb}) \leq V_{fv} \leq (1+V_{xb})$ and $(1.5+V_{xb}) \leq V_{fv} \leq 2(V)$, respectively.

Furthermore, the function voltage $V_{h1}$ has the wave pattern modified from the function voltage $V_{g1}$ as shown in FIG. 12(E) while the function voltage $V_{h2}$ has the wave pattern modified from the function voltage $V_{g2}$, as shown in FIG. 12(F). In this instance, the function voltage $V_{h1}$ is formed by modifying into an arc the waveform portion of the function voltage $V_{g1}$ symmetrically with respect to the analog voltage $V_{fv}=0.5(V)$ over a range of $V_{90-xa} \leq V_{fv} \leq (0.5+V_{90-xa})$ and is also formed by modifying into an arc the waveform portion of the function voltage $V_{g1}$ symmetrically with respect to the analog voltage $V_{fv}=1.5(V)$ over a range of $(1+V_{90-xa}) \leq V_{fv} \leq (0.5+V_{90-xa})$. Meanwhile, the function voltage $V_{h2}$ is formed by modifying into an arc the waveform portions of function voltage $V_{g2}$ over ranges of $0 \leq V_{fv} \leq V_{xa}$, $(1-V_{xa}) \leq V_{fv} \leq (1+V_{xa})$ and $(2=V_{xa}) \leq V_{fv} \leq 2(V)$ respectively. Thus, the terminal voltage $V_{11}$ across the coil 11 is given by a quasi-sine waveform or an approximation of a sine waveform as shown in FIG. 13(A) while the terminal voltage $V_{12}$ of the coil 12 is given by a quasi-cosine waveform or approximation of a cosine waveform as shown in FIG. 13(B). This means that the terminal voltages $V_{11}$, $V_{12}$ change in such a manner to facilitate relaxation in changes of the waveform at the bending points as previously described in the first embodiment. In this instance, magnetic fields caused by the terminal voltages $V_{11}$, $V_{12}$ are combined to produce a resultant magnetic field which rotates in a direction defined by order of the reference characters ①→②→③→④, as shown in FIG. 13(C). Additionally, the positions defined by the reference characters ①, ②, ③ and ④ on a circle in FIG. 13(C) correspond respectively to the points defined by the reference characters ①, ②, ③ and ④ shown in FIGS. 13(A)(B).

Thus, the pointer 14 is swept by magnetic fields issued from the coils 11, 12 in accordance with the terminal voltages $V_{11}$, $V_{12}$ as previously described. This facilitates smooth sweeping movement of the pointer 14 around the bending points as described in the first embodiment without disharmonious feelings given to the driver. Furthermore, the function generators 150 to 180 are adapted to generate the terminal voltages $V_{11}$, $V_{12}$ with quasi sine and cosine waveforms, as previously described. This effectively prevents stop or sudden movement of the pointer 14 caused at the bending points on trapezoid or triangular waveforms of terminal voltages given to the coils 11, 12 without superposition of ripple signals from surplus condensers to the terminal voltages. Incidentally, a dotted line of FIG. 14 depicts a characteristic curve representative of an indicating error FG via the angle S in the second embodiment. This shows further decrease of the indicating error FG in the second embodiment compared with the indicating error FG in the first embodiment (see the characteristic curve shown by a solid line of FIG. 14).

Figure 15:
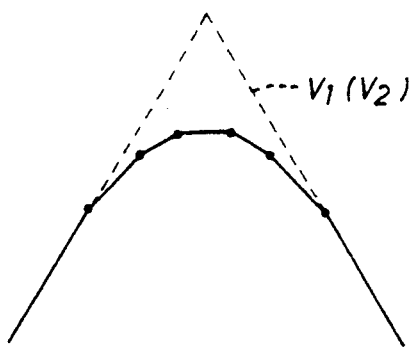
FIGS. 15 and 16 depict partial waveforms of function voltages in modifications of the front stage function generators in FIG. 10(B)
Figure 16:
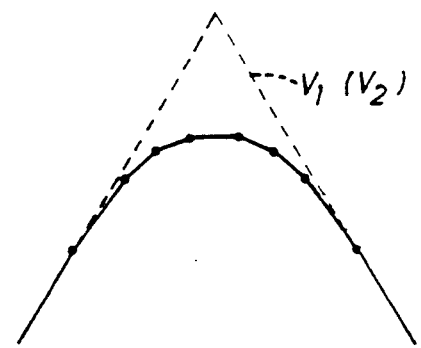

Although in the above second embodiment each of the function generators 150, 160 is formed by the single stage construction shown in FIG. 10(B), the function generator 150 or 160 may be also replaced with another function generator in which function generators 150 or 160 are cascaded in for instance two or three stages to cause the function generator 170 or 180 to generate a function voltage shown by a solid line of FIG. 15 or 16 on a basis of the triangular wave voltage $V_1$ or $V_2$. This facilitates approximation of the terminal voltage $V_{11}$ to the sine wave or approximation of the terminal voltage $V_{12}$ to the cosine wave.

While in the above second embodiment the steering logic circuit 190 is adapted because each of the driving circuits 200, 210 is of the bridge type, it may be eliminated in case each of the driving circuits 200, 210 is of a certain type other than the bridge type.

Figure 17:
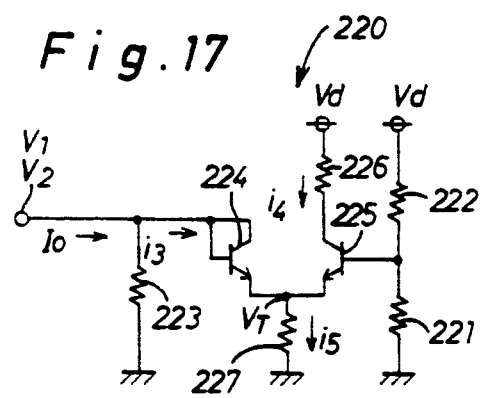
FIG. 17 illustrates a modification of each pair of the cascaded function generators in FIG. 10(B)

FIG. 17 illustrates another modification of the second embodiment in which the function generators 150, 170 or 160, 180 are replaced with a function generator 220 shown in FIG. 17. The function generator 220 includes a pair of resistors 221, 222 which are connected in series with each other to divide the D.C. voltage Vd from the battery B into a divided voltage Vr. The divided voltage Vr defines a value for relaxing change in vertical portions of the waveforms of the triangular wave voltages $V_1$, $V_2$ from the I-V converters 130, 140.

The function generator 220 includes a resistor 223 which receives a triangular wave current $I_0$ corresponding to the voltage $V_1$ or $V_2$ from I-V converter 130 or 140 to generate a terminal voltage $V_0$ satisfying an equation $V_0=(I-I_3)R_3$. In this equation, the reference character $R_3$ indicates a resistance value of the resistor 223, and the reference character $i_3$ indicates an electric current flowing into a current generator in the form of a transistor 224. The transistor 224 maintains the current $i_3$ in a constant current in accordance with a base-emitter voltage $V_{BE5}$ thereof. A current amplifier in the form of a transistor 225 is biased by the divided voltage $V_r$ from resistors 221, 222 to generate an electric voltage $V_T$ at its emitter and maintain it in a constant value in accordance with change of an electric current $i_4$ which flows through a protective resistor 226 into the collector of transistor 225. A resistor 227 is grounded at its one end and connected at its other end to the emitters of transistors 224, 225. Then, the resistor 227 receives at its other end the voltage $V_T$ from the emitter of transistor 225 to flow therethrough an electric current $i_5$ satisfying an equation $=(I_0-V_0/R_3)\times 2$. In this instance, the current $i_5$ is adjusted by the resistor 227 to accord the base-emitter voltage $V_{BE5}$ of transistor 224 with the base-emitter voltage $V_{BE6}$ when the current $I_0$ is maintained in a maximum value. Other construction of this modification is the same as that of the second embodiment.

In operation, it is assumed that the I-V converters 130, 140 generate the triangular wave voltages $V_1$, $V_2$ in accordance with changes of the analog voltage $V_{fv}$ from F-V converter 80, as previously described in the second embodiment. When a terminal voltage $V_0$ across the resistor 223 becomes higher than an electric voltage $V_T$ across the resistor 227 in accordance with an increase of the terminal voltage $V_0$ from zero (V), an electric current $i_3$ starts to flow through the transistor 224 in such a manner to satisfy $V_{BE5}=V_0-V_T$. If a resistance value of the resistor 227 is determined to be a value causing the current $i_3$ to accord with the current $i_4$ when the terminal voltage $V_0$ across the resistor 223 is equal to the divided voltage $V_f$ from resistors 221, 222, a maximum value of the terminal voltage $V_0$ can be determined on a basis of satisfaction of an inequality $V_0 \leq V_r$ (see FIG. 18). Meanwhile, lowering of the terminal voltage $V_0$ effects the same operation as that in rising of the terminal voltage $V_0$.

Figure 19:
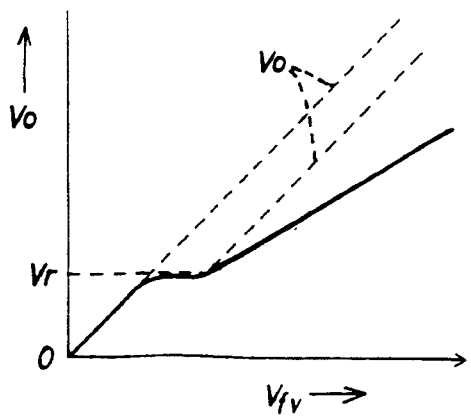
FIGS. 18 and 19 depict graphs providing an understanding of the operation of the modification of FIG. 17.
Figure 18:
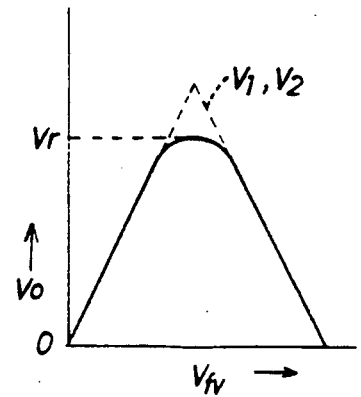

Thus, the transistor 225 restrains a current flowing therethrough based on about the divided voltage $V_r$ and is turned off in a range of $V_0 > V_r$ to absorb the current $i_3$ determined by the terminal voltage $V_0$, the base-emitter voltage $V_{BE5}$ and the resistance value of resistor 227. This affects change in slope of waveform defined by $V_0=V_1$(or $V_2$), (see a solid line of FIG. 19). As a result, each vertical portion of the triangular voltages $V_1$, $V_2$ is limited to vary relaxedly in relation to the divided voltage $V_r$, as shown in FIG. 18. In addition, the current $i_3$ is defined by an equation $i_3 = Is \exp\{q(V_0-V_T)/KT\}$.

When function voltages are generated from the function generators 220 in accordance with the above-mentioned operation, they are converted into a terminal voltage $V_{11}$ with quasi-sine waveform and a terminal voltage $V_{12}$ with quasi-consine waveform in the same manner as those in the second embodiment. This affects smooth sweeping movement of the pointer 14 dependent on changes of the analog voltage $V_{fv}$ as that in the second embodiment and more effectively restrains the above-mentioned disharmonious feelings. Furthermore, the function generators 220 are adapted to surely prevent stop or sudden movement of the pointer 14 caused at the bending points of trapezoid or triangular waveforms of terminal voltages given to the coils 11, 12 without superposition of ripple signals from surplus condensers to the terminal voltages. Other operation and effect are the same as those in the second embodiment.

Figure 20:
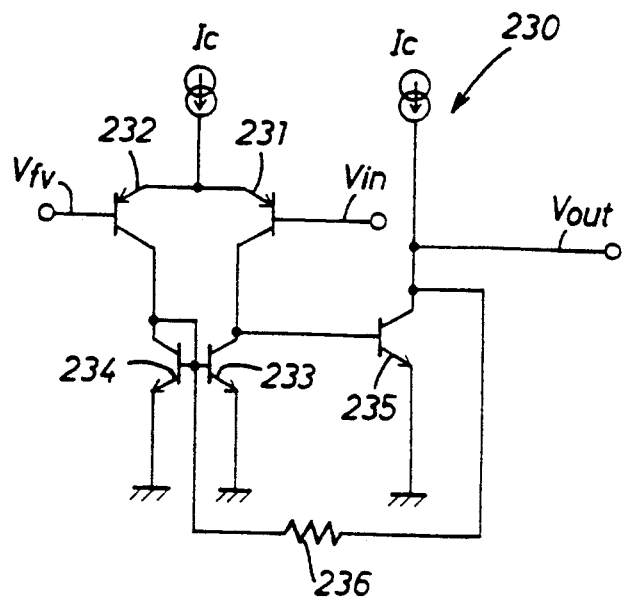
FIG. 20 illustrates a partial circuit diagram of a modification of a comparator circuit in FIG. 10(A)

FIG. 20 illustrates a further modification of the second embodiment in which each of the comparators 103, 104 and 105 of the comparator circuit 100 is replaced with a comparator 230 having a hystersis characteristic defined by a very narrow hysteresis width. The comparator 230 includes a transistor 231 for differential input which receives at its base the first, third or fifth reference voltage (hereinafter called as a reference voltage Vin) from the common terminal 91a, 93a or 95a of the reference voltage generator 90. The comparator 230 also includes a transistor 232 for differential input which receives at its base the analog voltage $V_{fv}$ from the F-V converter 80. When $V_{fv} < V_{in}$ is maintained during rise of the analog voltage $V_{fv}$ from zero (V), the transistor 232 is turned on together with transistors 233, 234 for current amplification, while the transistor 231 is turned off together with a transistor 235 for differential amplification. In this instance, an electric current from the collector of transistor 235 is flowing through a resistor 236 for very narrow hysteresis width into the bases of transistors 233, 234. In addition, the current flowing through resistor 236 is defined by the ratio {(an output voltage Vout—a base voltage of transistor 234)/ a resistance value Rh of resistor 235}.

When the transistor 232 is turned off upon satisfaction of $V_{fv} > V_{in}$, the transistors 233, 234 are controlled at their base potentials to decrease a collector current of the transistor 233 compared with a collector current of the transistor 231. Thus, the transistor 235 is turned on to absorb base currents of transistors 233, 234 with an electric current defined by the ratio {(base potentials of transistors 233, 234)}—(collector potential of transistor 235)/the resistance value Rn. This lowers the base potentials of transistors 233, 234 rapidly down to zero (V). When the analog voltage $V_{fv}$ lowers gradually, the transistor 235 is controlled from the turning-on condition to the turning-off condition by way of the reverse operation from that as previously described.

On a basis of the operation as described above, is resolved the drawback that prior to lowering of the base potentials of transistors 233, 234 down to zero (V) without the resistor 236, the analog voltage $V_{fv}$ is rendered lower than the reference voltage $V_{in}$ due to various noises to oscillate output of the transistor 235. In other words, time duration in turning off of the transistors 233, 234 is shortened by the resistor 236 to effect alternative changes between turning off and on of transistor 236 without oscillation.

Figure 21:
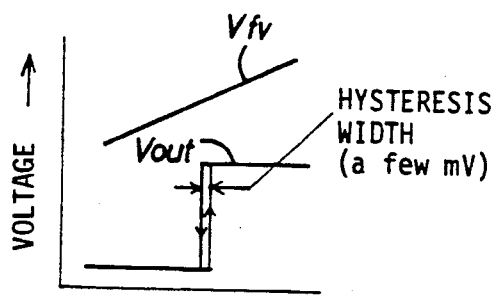
FIG. 21 is a graph providing an understanding of the operation of the modification in FIG. 20.

Assuming that the resistance value $R_h$ of resistor 236 is equal to 300 (kΩ), an electric current absorbed through the resistor 236 from the bases of transistors 233, 234 is given by 0.68(V)/300(kΩ)=2.3 μA). This means that even if the analog voltage $V_{fv}$ rises or lowers slowly, an output Vout of the comparator 230 can be rapidly changed to make the hysteresis width very narrow (see FIG. 21).

From the above description, it should be understood that outputs of the current generator 110 and logic circuit 190c and the terminal voltages of the coils 11, 12 can be affected without oscillation to surely prevent the pointer 14 from vibration. This effect can be easily attained by simply the construction that the resistor 236 be added to a conventional differential amplifier to form the comparator 230.

Figure 22:
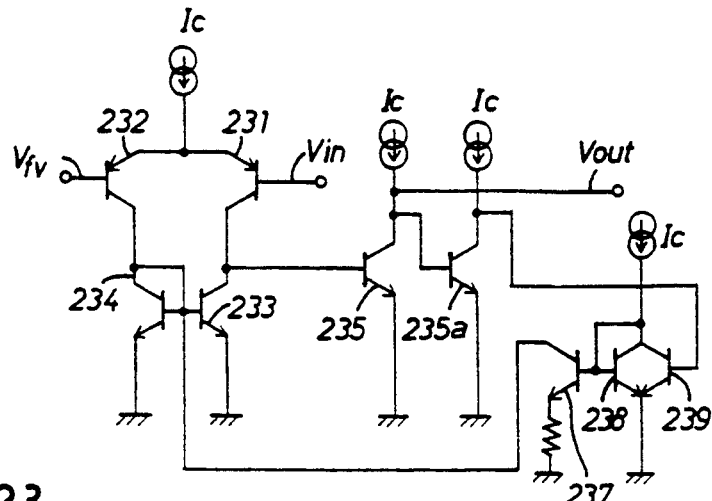
FIGS. 22 to 24 illustrate circuit diagrams further modified from the modification of FIG. 20.

Although in the above-mentioned further modification the resistor 236 is adapted to provide the very narrow hysteresis width in the comparator 230, it may be replaced with a minute constant current circuit which is constructed by transistors 237, 238 and 239, as shown in FIG. 22, to issue a minute constant current. In this case, the minute constant current circuit is operated to absorb the base currents of transistors 233, 234 so as to provide a comparator with such a very narrow hysteresis width as that described in the further modification. In addition, a transistor 235a has the same function as that of the transistor 235.

Figure 23:
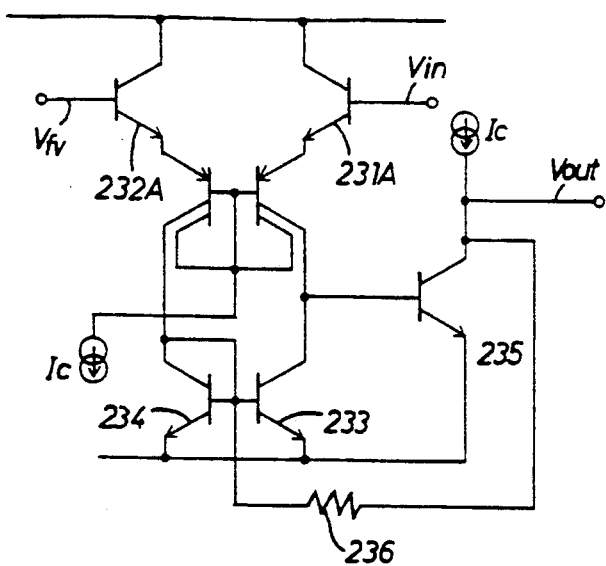
Figure 24:
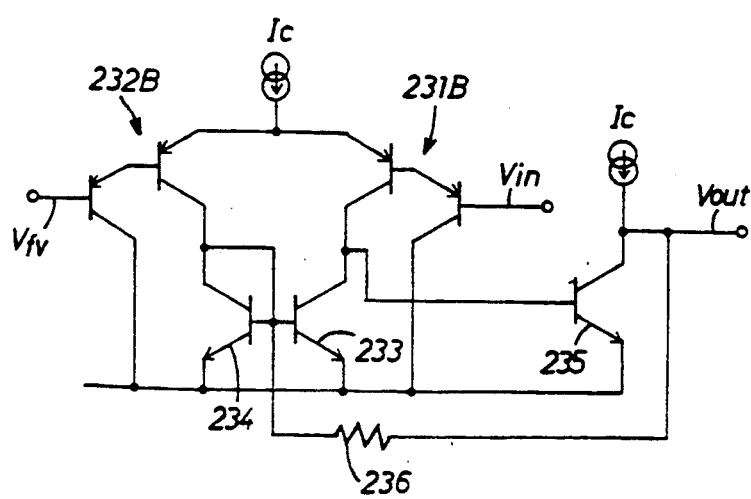

While in the above-mentioned further modification the transistors 231, 232 are of the PNP type respectively, they are replaced with transistors 231A, 232A of the NPN type, as shown in FIG. 23 or replaced with Darlington circuits 231B, 232B, as shown in FIG. 24.

For the practice of the invention, the present invention may be adapted to a driving apparatus having various air core gauges for indicating the quantities of various analog inputs.

Having now fully set forth both structure and operation of preferred embodiments of the concept underlying the present invention, various other embodiments as well as certain variations and modifications of the embodiments herein shown and described will obviously occur to those skilled in the art upon becoming familiar with said underlying concept. It is to be understood, therefore, that within the scope of the appended claims the invention may be practiced otherwise than as specifically set forth herein.

What is claimed is:

1. An apparatus for driving a gauge to indicate an input quantity applied thereto, said gauge having first and second coils arranged in quadrature to generate a resultant magnetic field in response to electric currents applied thereto and having a pointer associated with said first and second coils to be angularly swept by the resultant magnetic field, said apparatus comprising:
   a first triangular wave generator means for generating a first triangular wave signal in response to the input quantity;
   a second triangular wave generator means for generating a second triangular wave signal in response to the input quantity, said second triangular wave being 90° out of phase with the first triangular wave signal;
   a first function generator means responsive to the first triangular wave signal for modifying peak waveform portions of the first triangular wave signal into modified waveform portions formed by straight line segments with internal obtuse angles therebetween and for generating a first line function signal having the modified waveform portions;
   a second function generator means responsive to the second triangular wave signal for modifying peak waveform portions of the second triangular wave signal into modified waveform portions formed by straight line segments with internal obtuse angles therebetween and for generating a second line function signal having the modified waveform portions;
   an approximate sine function generator means responsive to the first line function signal for converting the modified waveform portions of the first line function signal into first circular arc waveform portions and for generating an approximate sine function signal having the first circular arc waveform portions;
   an approximate cosine function generator means responsive to the second line function signal for converting the modified waveform portions of the second line function signal into second circular arc waveform portions and for generating an approximate cosine function signal having the second circular arc waveform portions; and,
   driving means responsive to the approximate sine and cosine function signals for driving said first and second coils, respectively, with electric currents proportional to the signal levels of the approximate sine and cosine function signals.

2. An apparatus for driving a gauge to indicate an input quantity applied thereto, said gauge having first and second coils arranged in quadrature to generate a resultant magnetic field in response to electric currents applied thereto and having a pointer associated with said first and second coils to be angularly swept by the resultant magnetic field, said apparatus comprising:
   a signal generator means for generating first, second and third signals when the input quantity is maintained at a first, second and third level corresponding to a range of 0° to 90°, 0° to 180°, and 0° to 270° of the sweep angle respectively;
   a first triangular wave generator means responsive to the first and third signals for generating a first triangular wave signal;
   a second triangular wave generator means responsive to the second signal for generating a second triangular wave signal, the second triangular wave signal being 90° out of phase with the first triangular wave signal;
   a first function generator means responsive to the first triangular wave signal for generating a first function signal having an approximation of a waveform characteristic of a sine function;
   a second function generator means responsive to the second triangular wave signal for generating a second function signal having an approximation of a waveform characteristic of a cosine function; and,
   driving means responsive to the first and second function signals for driving said first and second coils, respectively, with electric currents proportional to the signal level of the first and second function signals.

3. The apparatus of claim 2, wherein said first function generator means comprises means for generating said first function signal by modifying peak waveform portions of the first triangular wave signal into a waveform configuration having peaks formed by straight line segments with internal obtuse angles therebetween, said modified waveform portions of said first function signal closely representing an arc; and,
   wherein said second function generator means comprises means for generating said second function signal by modifying peak waveform portions of the second triangular wave signal into a waveform configuration having peaks formed by straight line segments with internal obtuse angles therebetween, said modified waveform portions of said second function signal closely representing an arc.

4. The apparatus of claim 2, wherein said signal generator means comprises:
   a reference signal generator means for generating first, second and third reference signals at levels corresponding to 90°, 180° and 270° of the sweep angle respectively;
   a first comparator having a hysteresis width inclusive of the level of the first reference signal wherein said first signal is generated only when the first level of the input quantity is maintained below the hysteresis width of said first comparator;

a second comparator having a hysteresis width inclusive of the level of the second reference signal wherein said second signal is generated only when the second level of the input quantity is maintained below the hysteresis width of said second comparator; and, a third comparator having a hysteresis width inclusive of the level of the third reference signal wherein said third signal is generated only when the third level of the input quantity is maintained below the hysteresis width of said third comparator.

5. An apparatus for driving a gauge to indicate an input quantity applied thereto, said gauge having first and second coils arranged in quadrature to generate a resultant magnetic field in response to electric currents applied thereto and having a pointer associated with said first and second coils to be angularly swept by the resultant magnetic field, said apparatus comprising:

a first triangular wave generator means for generating a first triangular wave signal in response to the input quantity;

a second triangular wave generator means for generating a second triangular wave signal in response to the input quantity, said second triangular wave being 90° out of phase with the first triangular wave signal;

a first function generator means, responsive to the first triangular wave signal, for generating a first function signal having bottom waveform portions which vary in synchrony with corresponding bottom waveform portions of said first triangular wave signal, and said first function signal further having top waveform portions which are modified into waveform portions formed by straight line segments with internal obtuse angles therebetween, said top waveform portions corresponding to top waveform portions of the first triangular wave signal;

a second function generator means, responsive to the second triangular wave signal, for generating a second function signal having bottom waveform portions which vary in synchrony with corresponding bottom waveform portions of said second triangular wave signal, and said second function signal further having top waveform portions which are modified into waveform portions formed by straight line segments with internal obtuse angles therebetween, said top waveform portions corresponding to top waveform portions of the second triangular wave signal;

a third function generator means responsive to the first function signal for generating a third function signal having top waveform portions which are modified into first circular arc waveform portions from the corresponding modified top waveform portions of the first function signal;

a fourth function generator means responsive to the second function signal for generating a fourth function signal having top waveform portions which are modified into second circular arc waveform portions from the corresponding modified top waveform portions of the second function signal;

an approximate sine function generator means responsive to the third function signal for alternately inverting the polarity of adjacent bottom portions of the third function signal so as to convert the waveform of the third function signal into an approximate sine waveform and to generate an approximate sine function signal having the approximate sine waveform;

an approximate cosine function generator means responsive to the fourth function signal for alternately inverting the polarity of adjacent bottom portions of the fourth function signal so as to convert the waveform of the fourth function signal into an approximate cosine waveform and to generate an approximate cosine function signal having the approximate cosine waveform; and, driving means responsive to the approximate sine and cosine function signals for driving said first and second coils, respectively, with electric currents proportional to the level of the approximate sine and cosine function signals.

* * * * *